(12) United States Patent
Sato et al.

(10) Patent No.: US 7,449,727 B2
(45) Date of Patent: Nov. 11, 2008

(54) OVERVOLTAGE-PROTECTED LIGHT-EMITTING SEMICONDUCTOR DEVICE

(75) Inventors: Junji Sato, Niiza (JP); Mikio Tazima, Niiza (JP); Tetsuji Moku, Niiza (JP); Arei Niwa, Niiza (JP); Yasuhiro Kamii, Niiza (JP)

(73) Assignee: Sanken Electric Co., Ltd. (JP)

( * ) Notice: Subject to any disclaimer, the term of this patent is extended or adjusted under 35 U.S.C. 154(b) by 212 days.

(21) Appl. No.: 11/343,798

(22) Filed: Jan. 31, 2006

(65) Prior Publication Data

US 2006/0181828 A1  Aug. 17, 2006

(30) Foreign Application Priority Data

Feb. 16, 2005 (JP) ............... 2005-039649

(51) Int. Cl.
*H01L 31/0328* (2006.01)
*H01L 31/0336* (2006.01)
*H01L 31/072* (2006.01)
*H01L 31/109* (2006.01)

(52) U.S. Cl. ............... 257/186; 257/184; 257/E33.016
(58) Field of Classification Search ............ 257/186, 257/184, E33.016
See application file for complete search history.

(56) References Cited

U.S. PATENT DOCUMENTS

2002/0179914 A1* 12/2002 Sheu ............ 257/90
2005/0168899 A1* 8/2005 Sato et al. ............ 361/91.1

FOREIGN PATENT DOCUMENTS

JP  10-065215 A  3/1998
JP  10-200159 A  7/1998

* cited by examiner

*Primary Examiner*—Phat X Cao
(74) *Attorney, Agent, or Firm*—Woodcock Washburn LLP

(57) ABSTRACT

An LED incorporating an overvoltage protector with a minimum of space requirement. The LED itself comprises a p-type semiconductor substrate, a light-generating semiconductor region grown epitaxially thereon, a first electrode on the light-generating semiconductor region, and a second electrode on the underside of the substrate. The standard method of LED fabrication is such that the substrate is notionally divisible into a main portion in register with the overlying light-generating semiconductor region and, surrounding the main portion, a tubular marginal portion needed for dicing the wafer into individual squares or dice. The overvoltage protector comprises an n-type semiconductor film formed on the marginal portion of the substrate and held against the side surfaces of the light-generating semiconductor region via an insulating film. Creating a pn junction with the marginal portion of the p-type substrate, the n-type semiconductor film provides an overvoltage protector diode which is electrically connected reversely in parallel with the LED. Various other embodiments are disclosed.

8 Claims, 21 Drawing Sheets

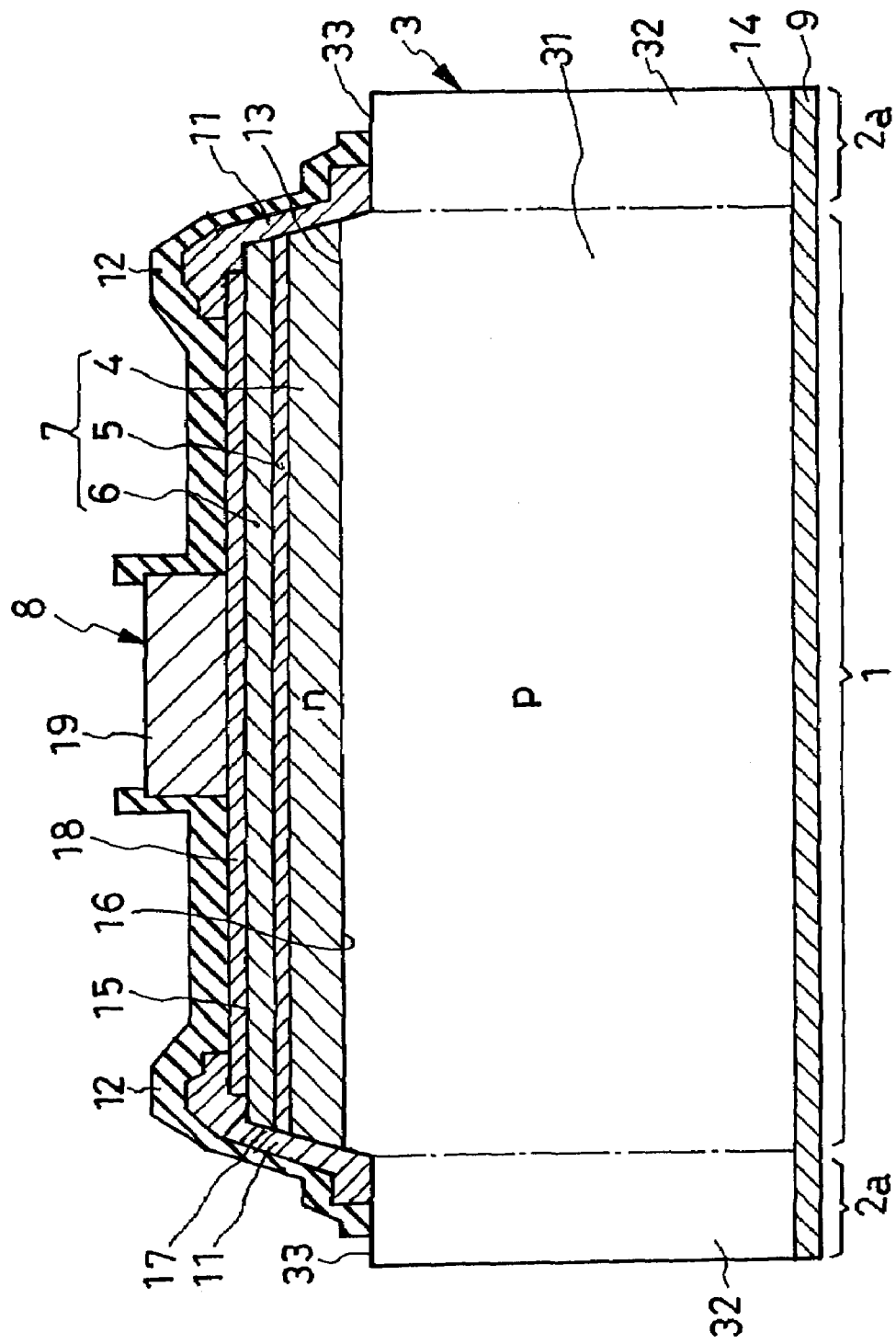

US 7,449,727 B2

OVERVOLTAGE-PROTECTED LIGHT-EMITTING SEMICONDUCTOR DEVICE

CROSS REFERENCE TO RELATED APPLICATIONS

This application claims priority to Japanese Patent Application No. 2005-039649, filed Feb. 16, 2005.

BACKGROUND OF THE INVENTION

This invention relates to light-emitting semiconductor devices, or light-emitting diodes (LEDs) according to common parlance, and more specifically to such devices integrally incorporating an overvoltage protector.

Currently attracting the attention of the specialists in the light-emitting semiconductor art are the nitrides capable of generating light in the wavelength range of 365 to 550 nanometers. The devices employing this class of nitride semiconductors, as heretofore made, were mostly capable of resisting electrostatic breakdown only up to 100 volts or so. Attempts have been made to make the devices more immune to electrostatic breakdown. Japanese Unexamined Patent Publication Nos. 10-65215 and 10-200159 are examples. They teach to build an overvoltage protector, which takes the form of a pn-junction diode, on the same sapphire substrate as the LED. The LED and the protector diode are electrically connected reversely in parallel with each other.

In the operation of this prior art overvoltage-protected LED, the protector diode is reverse biased during application of a forward voltage to the LED. The current flows then mostly through the LED and hardly through the protector diode. The protector diode is forward biased, on the other hand, during application of a reverse voltage to the LED. Conduction is then initiated through the protector diode in response to a voltage not less than the predefined conduction-initiating voltage of the protector diode. In that event, therefore, the voltage across the LED is limited to the forward voltage of the protector diode.

This prior art overvoltage-protected LED has proved to possess some inherent shortcomings, however. First of all, it is unnecessarily bulky in size as an inevitable result of the side-by-side arrangement of the LED and the protector diode on the sapphire substrate. The overvoltage-protected LED might be fabricated in the same chip size as the more conventional non-overvoltage-protected LED. But then the LED itself would become so small in size that only a correspondingly less optical output would be obtained. An additional increase in the size of the prior art overvoltage-protected LED results from the need for provision of conductors for interconnecting the juxtaposed LED and protector diode reversely in parallel with each other.

Another drawback arises from the epitaxial growth of the protector diode at the same time with that of the LED according to Japanese Unexamined Patent Publication No. 10-65215, supra. The thickness of the protector diode is therefore subject to that of the LED, making it difficult to set the forward voltage of the protector diode as desired or required. The required forward voltage of the protector diode is higher than the normal reverse voltage of the LED and less than its maximum allowable reverse voltage.

Japanese Unexamined Patent Publication No. 10-65215 also discloses an embodiment in which the LED comprises an active layer of indium gallium nitride sandwiched between two gallium nitride claddings of opposite conductivity types. The protector diode on the other hand comprises a first layer having the same composition as, and joined directly to the n-type cladding of the LED, a second layer of the same composition as the active layer of the LED, and a third layer of the same composition as the p-type cladding of the LED. The cathode on the first layer of the protector diode is electrically connected to the cathode of the LED, which in turn is connected to its n-type cladding. Thus the cathodes of the LED and protector diode are both connected to the same n-type GaN layer. Should they be situated too close to each other, a current might flow therebetween, and no current to the LED. This risk is precludable only by provision of a sufficient space between the cathodes of the LED and the protector diode, a solution objectionable for the resulting increase in the size of the complete device.

The same unexamined Japanese patent publication indicates another embodiment in which a resistor, formed by an extension from the p-type cladding of the active layer of the LED, is connected between the anode and cathode of the LED by way of an overvoltage protector. The cathode of the LED is more or less in Schottky contact with the extension of the p-type cladding of its active layer This prior art overvoltage-protected LED may therefore be equivalently electrically diagramed as in FIG. 29 of the drawings attached hereto. A Schottky barrier diode SD is therein shown connected via the protector resistor $R_3$ between anode 101 and cathode 102 of the LED. The protector resistor $R_3$ has a value determined by the dimension of the p-type cladding between anode 101 and Schottky barrier diode SD. The Schottky barrier diode SD is connected forwardly in parallel with the LED via the protector resistor $R_3$. As a consequence, if the protector resistor $R_3$ were too low in resistance, a current would not flow therethrough upon application of a forward voltage to the LED. No light would then issue. The sum of the forward resistance $R_2$ of the Schottky barrier diode SD and the resistance of the protector resistor $R_3$ must be sufficiently greater than the forward resistance $R_1$ of the LED in order for the LED to emit light. The sum of the reverse resistance $r_2$ of the Schottky barrier diode SD and the resistance of the protector resistor $R_3$ must be sufficiently less than the reverse resistance $r_1$ of the LED in order for the protector resistor $R_3$ to perform its function of overvoltage protection.

Difficulties have been encountered in creating the extension of the p-type cladding so as to meet the foregoing conditions for the proper operation and functioning of the overvoltage-protected LED. Another objection to the extension of the p-type cladding is that, again, it necessitates an increase in the size of the overvoltage-protected LED.

SUMMARY OF THE INVENTION

The present invention has it as an object to combine a light-emitting semiconductor device and an overvoltage protector therefor into an integrated semiconductor device of simpler, more compact and less expensive construction than heretofore.

Another object of the invention is to combine the overvoltage-protected light-emitting semiconductor device with a photosensor into what is known as a photocoupler without adding to the size of the semiconductor device.

Briefly, the invention may be summarized as a light-emitting semiconductor device protected against overvoltages. Included is a light-generating semiconductor region which is formed on a major surface of a substrate of electroconductive material. The light-generating semiconductor region has a first major surface facing away from the substrate, a second major surface held against the major surface of the substrate, and a side surface between the first and the second major surface. A first electrode is formed on the first major surface of the light-generating semiconductor region, and a second electrode is coupled to the substrate, as by being bonded directly to its underside. Also included, and constituting a feature of the invention, is an overvoltage protector which is formed at least on the side surface of the light-generating semiconductor region and which is electrically connected between the first and the second electrode for protecting the light-emitting semiconductor device from forward and/or reverse overvoltages.

Made by the usual mass production practice of the semiconductor industry, the substrate has an annular or tubular marginal portion around its main portion. The marginal portion is not an addition to, or an extension from, the substrate introduced by this invention for embodying its teachings but a necessary adjunct of the substrate for mass production of semiconductor devices in general. Since the light-generating semiconductor region overlies the substrate only in register with its main portion, the marginal portion has a space thereover that is left unoccupied by the light-generating semiconductor region. The instant invention utilizes the unoccupied space over the marginal portion, as well as this marginal portion itself, for incorporating the overvoltage protector into the light-emitting semiconductor device. Practically no increase is therefore needed in the size of the LED of standard design for provision of the overvoltage-protected light-emitting semiconductor device proposed by the present invention.

It is not desired, however, that the marginal portion of the substrate be considered a prerequisite for incorporating an overvoltage protector with a light-emitting semiconductor device according to the invention. The overvoltage protector is installable by being mounted to, or grown on, the side surface of the light-generating semiconductor region with little increase in the size of the device having no marginal portion on its substrate.

The overvoltage protector can be any known device capable of protecting light-emitting semiconductor devices from overvoltages in the manners described herein. Examples include a pn-junction diode, npn or pnp diode, Schottky diode, varistor, capacitor, or various combinations thereof. Any such overvoltage protector may be fabricated in film form in situ on the device, with or without use of part of the substrate as a constituent part or parts of the protector. Alternatively, there may be adopted preformed discrete devices including those commercially available in chip form.

In one embodiment of the invention disclosed herein the overvoltage protector includes an annular semiconductor film of one conductivity type grown on the side surface of the light-generating semiconductor region. The semiconductor film has one longitudinal edge thereof held against the marginal portion of the substrate of an opposite conductivity type, and another longitudinal edge joined to the first electrode. The semiconductor film and the substrate marginal portion provide in combination a pn-junction diode electrically connected reversely in parallel with the light-generating section of the device to serve as overvoltage protector therefor. This overvoltage protector construction is preferred because the semiconductor film is easy to form on the side surface of the light-generating semiconductor region without substantially adding to the overall size of the device.

In another embodiment the above semiconductor film of the overvoltage protector is made from the same material as is a transparent overlay which covers the first major surface of the light-generating semiconductor region and which forms a part of the first electrode, another part of the first electrode being a bonding pad placed centrally on the transparent overlay. The semiconductor film will then be capable of joint fabrication with the transparent overlay of the first electrode, making possible a further reduction in the manufacturing cost of the device. Being transparent, moreover, the semiconductor film will permit light to issue from the side surface of the light-generating semiconductor region as well.

A still another embodiment is disclosed in which the noted semiconductor film of the overvoltage protector is also transparent and additionally covers the transparent overlay of the first electrode to serve an additional purpose of protective covering against moisture and physical impairment. A conventional separate protective covering may then be either omitted or made less moisture- and scratch-resistant than heretofore.

It may also be noted that the substrate of the overvoltage-protected light-emitting semiconductor device according to the invention is electroconductive. The electroconductive substrate permits electrical connection therethrough of the light-emitting section and the overvoltage protector section of the device, particularly when the second electrode is formed on a second major surface of the substrate opposite to the first recited major surface on which is grown the light-generating semiconductor region. No extra conductors are needed for such connection.

There are also disclosed herein additional embodiments in which the invention is applied to a so-called photocoupler, a combination of an LED and a photosensor, the latter being usually used for monitoring the optical output from the former. Several overvoltage-protected, self-monitoring photocoupler constructions are disclosed in which the overvoltage protector section and photosensor section are made as much alike in construction as possible for ease of fabrication.

The above and other objects, features and advantages of this invention will become more apparent, and the invention itself will best be understood, from a study of the following description and appended claims, with reference had to the attached drawings showing some preferable embodiments of the invention.

BRIEF DESCRIPTION OF THE DRAWINGS

FIG. 5 is a section through another preferred form of overvoltage-protected light-emitting semiconductor device according to the invention.

DESCRIPTION OF THE PREFERRED EMBODIMENTS

General

Figure 1:
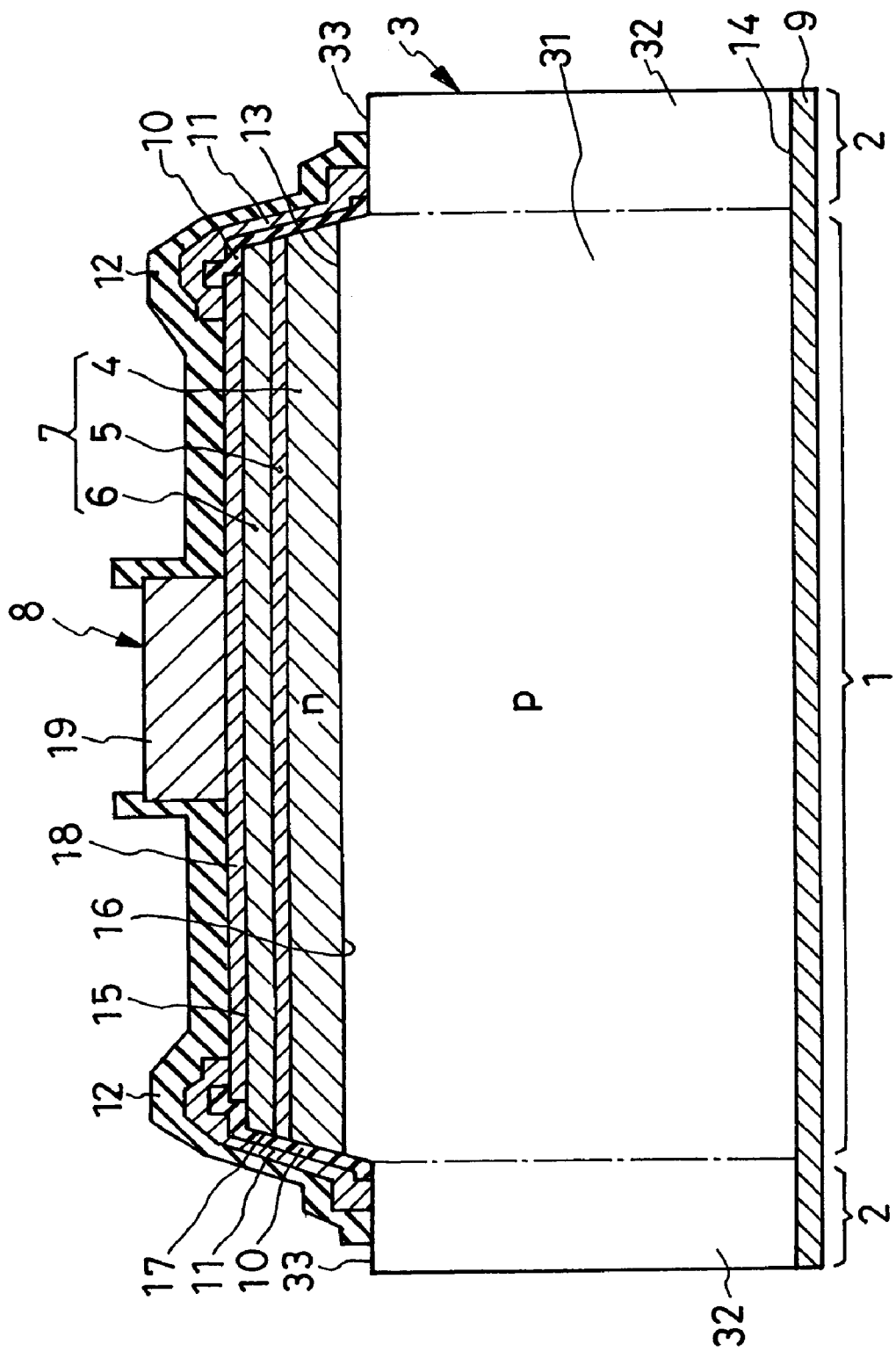
FIG. 1 is a section through the overvoltage-protected light-emitting semiconductor device embodying the principles of this invention.

The overvoltage-protected light-emitting semiconductor device or LED according to the invention will now be described more specifically in terms of its first preferred form illustrated in a vertical section in FIG. 1 and in a top plan in FIG. 2. The overvoltage-protected light-emitting semiconductor device could be called the composite semiconductor device. The representative overvoltage-protected LED is broadly divisible into an LED section 1 and an overvoltage protector section 2. The protector section 2 provides a diode in this embodiment for protecting the LED from overvoltages. Both LED section 1 and protector section 2 make use of a p-type silicon semiconductor substrate 3, but for different purposes. For convenience of description the substrate 3 may be thought of as comprising a main portion 31 and, around it, an annular or tubular marginal portion 32, with the border therebetween being indicated by the dot-and-dash lines in FIG. 1. The main portion 31 of the substrate 3 works mostly for the LED proper, and the marginal portion 32 mostly for the protector diode. More will be said later about the substrate 3.

With reference to FIG. 1 in particular the LED section 1 comprises a light-generating semiconductor region 7 formed on the main portion 31 of the substrate 3 to provide the primary working parts of the LED. The primary working parts of the LED are an n-type semiconductor layer or lower cladding 4, an active layer 5, and a p-type semiconductor layer or upper cladding 6 in this particular embodiment. The LED section 1 additionally comprises a first electrode 8 atop the light-generating semiconductor region 7, and a second electrode 9 on the underside of the substrate 3.

The overvoltage protector section 2 includes, in addition to the marginal portion 32 of the substrate 3, an insulating film 10 and an n-type semiconductor film 11, which are both mostly disposed in the space over the substrate marginal portion and held against the sides of the light-generating semiconductor region 7. Although insulated from the light-generating semiconductor region 7 by the insulating film 10, the n-type semiconductor film 11 makes direct contact with the marginal portion 32 of the p-type substrate 3 in order to provide a pn-junction diode for overvoltage protection. A transparent protective covering 12 of silicon dioxide or like material covers most of the first electrode 8 and all of the n-type semiconductor film 11 by way of moisture- and scratch-proofing.

The subsequent description of this overvoltage-protected light-emitting semiconductor device will be divided under the headings of "Substrate," "LED Section," and "Overvoltage Protector Section." Operational and functional description will follow the description under the above three headings.

Substrate

The substrate 3 is made from monocrystalline silicon into a rectangular piece of generally flat shape, having a pair of opposite major surfaces 13 and 14. The silicon semiconductor substrate 3 is doped with a conductivity type determinant of boron or like Group III element into p-type conductivity. The p-type impurity concentration of the substrate 3 is from $5\times10^{18}$ to $5\times10^{19}$ cm$^{-3}$, and its resistivity from 0.0001 to 0.0100 ohm-centimeters. The substrate 3 is therefore sufficiently electroconductive to provide part of the current path through the LED section 1 as well as part of the current path through the overvoltage protector section 2. Additionally, the substrate 3 serves as a baseplate for epitaxially growing the light-generating semiconductor region 7 thereon, and moreover as a mechanical support for this light-generating semiconductor region and the electrode 8 thereon. The substrate 3 will perform all these functions well if from 200 to 500 micrometers thick.

Figure 2:
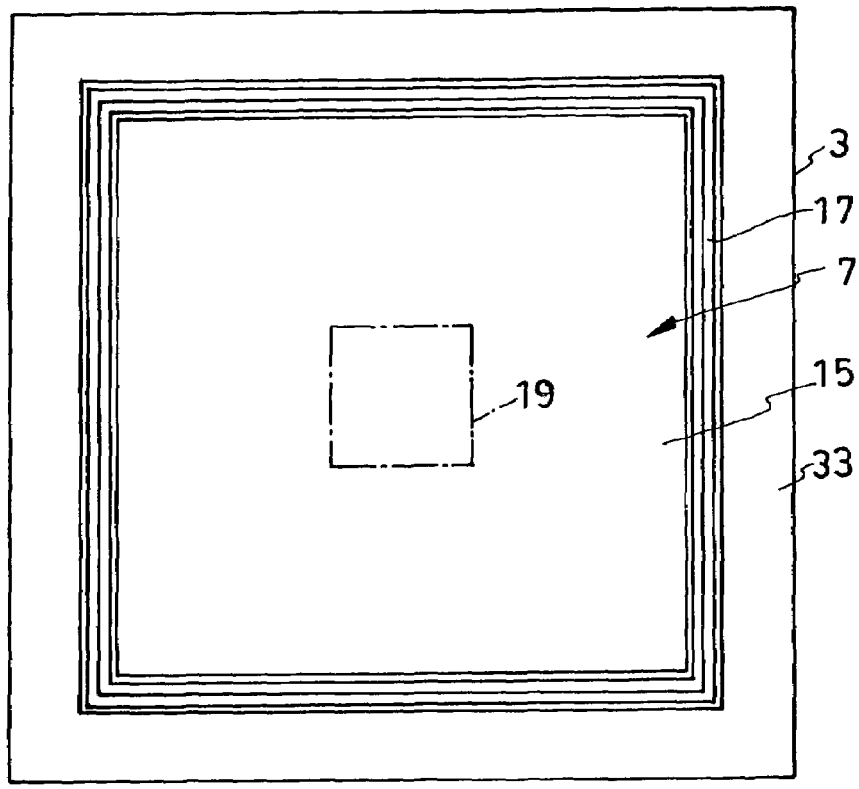
FIG. 2 is a top plan of the FIG. 1 device, not showing, however, the protective covering and some overvoltage protector means in order to reveal the substrate and the light-generating semiconductor region thereon.
Figure 3:
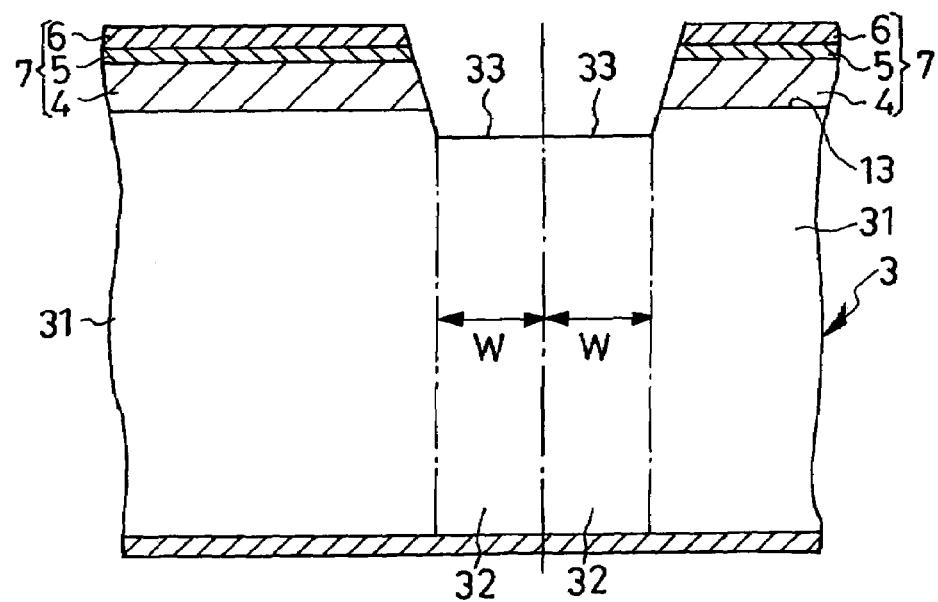
FIG. 3 is a fragmentary sectional view explanatory of how a semiconductor wafer with the light-generating semiconductor regions thereon are diced into squares such as that depicted in FIG. 2, with consequent creation of the marginal portion of the substrate utilized by the invention for installation of the overvoltage protector.

FIGS. 1-3 all indicate an annular ledge or depression 33 formed in the top surface 13 of the substrate 3 in register with its marginal portion 32. The usual practice in the semiconductor industry for mass production of this type of devices is such that the light-generating semiconductor region 7 is etched in a crisscross pattern after its three constituent layers 4-6 have been grown on the entire surface of a single, large semiconductor wafer. The etching is intended to divide the whole light-generating semiconductor region on the wafer into an array of square-shaped sections, as in FIG. 2, one for each overvoltage-protected light-emitting semiconductor device to be made. The crisscross etching of the light-generating semiconductor region usually results in an unintended creation of the aforesaid depressions or grooves as at 33 in FIG. 3 to a certain depth from the surface 13 of the substrate 3 around each light-generating semiconductor region 7.

With particular reference to FIG. 3 such grooves have each a width (w+w) needed for subsequent dicing of the wafer into individual squares or dice from which are made the overvoltage-protected light-emitting semiconductor devices. The present invention does not require that the substrate surface 13 be intentionally depressed at 33; instead, it may simply be exposed through the grooves conventionally created by etching as above in the light-generating semiconductor region 7.

It will also be understood that the annular marginal portion 32, having a width w, of the substrate 3 is a usual appendage of the LED resulting from its mass production. This and other embodiments of the invention to be presented subsequently make use of the space left unoccupied by the light-generating semiconductor region 7 over the marginal portion of the substrate, as well as the marginal portion itself, for installation of the overvoltage protector with little or no increase in the size of the LED. However, most of the embodiments disclosed herein are practicable if the substrate 3 has no such marginal portion.

LED Section

The n-type cladding 4, active layer 5, and p-type cladding 6 of the light-generating semiconductor region 7 of the LED section 1 are successively grown by epitaxy on the substrate 3. All these layers 4-6 are made from familiar nitride semiconductors, a type of Groups III-V compound semiconductors. A heterojunction is therefore created at the boundary between the p-type silicon semiconductor substrate 3 and the lowermost n-type cladding 4 of the light-generating semiconductor region 7. The voltage drop across the heterojunction upon application of is negligibly small, thanks to a known alloy layer, not shown, which is thermally created between p-type silicon semiconductor substrate 3 and n-type nitride semiconductor cladding 4 in the course of the fabrication of the light-generating semiconductor region 7. Alternative constructions are possible in which the p-type semiconductor substrate 3 is replaced by an n-type one, and the n-type semiconductor film 11 by a p-type one.

The light-generating semiconductor region 7 is subject to a variety of other modifications, substitutions, or additions. For example, a conventional buffer region may be interposed between the substrate 3 and the lower cladding 4 of the active layer 5. This active layer 5 itself may be multilayered, instead of monolayered as in FIGS. 1 and 3, according to the known multiple quantum well configuration. It is even possible to eliminate the active layer altogether if the double heterojunction is not required. The upper cladding 6 of the active layer 5 may also be modified to incorporate a known current-spreading layer or contact layer.

In the shape of a truncated pyramid or frustum, tapering as it extends away from the substrate 3, the light-generating semiconductor region 7 of this particular embodiment has a top surface 15, a bottom surface 16, and a set of four slanting side surfaces 17. Light issues mostly from the top surface 15 of the light-generating semiconductor region 7 and partly from its slanting side surfaces 17. The bottom surface 16 of the light-generating semiconductor region 7 is electrically and mechanically coupled to the major surface 13 of the substrate 3. The substrate 3 and light-generating semiconductor region 7 need not be square shaped as seen in a plan view as in FIG. 2 but may be of circular or other shape. As desired, moreover, only the substrate 3 may be a square while the light-generating semiconductor region 7 may be frustoconical or otherwise.

The first or top electrode 8 is shown as a combination of a transparent overlay 18 and a wire-bonding pad 19. The transparent overlay 18 covers nearly all the top surface 15 of the light-generating semiconductor region 7 in direct electrical contact with its p-type cladding 6. The bonding pad 19 is placed centrally on the transparent overlay 18. The transparent overlay 18 is made from a mixture (known as ITO and hereinafter referred to as such) of indium oxide ($In_2O_3$) and tin peroxide ($SnO_2$) to a thickness of approximately 100 nanometers. It may be fabricated, however, from other electroconductive materials such as zinc oxide or silver to a thickness that permits transmission of the light therethrough.

The bonding pad 19 must be smaller than the transparent overlay 18 but sufficiently large to permit bonding of connecting wire of aluminum or gold. Thicker than the transparent overlay 18 and substantially opaque, the bonding pad 19 occupies a limited part of the overlay surface, as indicated in phantom outline in FIG. 2, for minimal interference with the light issuing therefrom.

The second or bottom electrode 9 is joined to the bottom surface 14 of the substrate 3 in electrical contact therewith. Alternatively, since the substrate 3 is electroconductive, the second electrode 9 may be coupled to the peripheral part of the top surface 13 of the substrate.

Overvoltage Protector Section

With continued reference to FIGS. 1 and 2 the overvoltage protector section 2 of the overvoltage-protected LED includes as aforesaid the n-type semiconductor film 11 extending annularly over the four slanting side surfaces 17 of the light-generating semiconductor region 7 of the LED section 1. The n-type semiconductor film 11 has one longitudinal edge portion held against the marginal portion 32 of the p-type silicon semiconductor substrate 3 in pn junction, a midportion held against the slanting side surfaces 17 of the light-generating semiconductor region 7 via the insulating film 10, and another longitudinal edge portion making electrical contact with the transparent overlay 18 of the top electrode 8. Thus the marginal portion 32 of the p-type silicon semiconductor substrate 3 and the n-type semiconductor film 11 provide in combination the pn-junction diode used as overvoltage protector in this embodiment. By virtue of the marginal portion 32 of the substrate 3 and of the truncated pyramidal shape of the light-generating semiconductor region 7, the n-type semiconductor film 1 lies wholly inwardly of the substrate as seen in a plan view as in FIG. 2.

In order to permit light emission not only from the top surface 15 but from the slanting side surfaces 17, too, of the light-generating semiconductor region 7, the insulating film 10 and n-type semiconductor film 11 are each made as thin as one to two nanometers. The films of such thickness are sufficiently transparent to permit transmission therethrough of the light from the light-generating semiconductor region 7. The protective covering 12, which covers most of the top electrode 8 and all of the n-type semiconductor film 11 for moisture- and scratch-proofing of the LED, is also made from such a material, and to such thickness, as to be transparent to the light. However, the n-type semiconductor film 11 may be up to one micrometer thick, or even more, in cases where it can be nontransparent or of low transparency.

A preferred material of the n-type semiconductor film 11 is amorphous silicon. Other materials are adoptable, however, such as ITO, ZnO, $SnO_2$, $In_2O_3$, ZnS, ZnSe, $ZnSb_2O_6$, CdO, $CdIn_2O_4$, $MgIn_2O_4$, $ZnGa_2O_4$, $CdGa_2O_4$, $Ga_2O_3$, $GaIn_3$, $CdSnO_4$, $InGaMgO_4$, $InGaSZnO_4$, $Zn_2In_2O_5$, $AgSbO_3$, $Cd_2Sb_2O_7$, $Cd_2GeO_4$, $AgInO_2$, CdS, and CdSe. Any of these materials can be processed into film form by any such known techniques as physical or chemical vapor deposition, screen-printing, and sputtering.

It is not required, but is recommended, that the n-type semiconductor film 11 cover all, or nearly all, of the slanting side surfaces 17 of the light-generating semiconductor region 7. Overlying the complete, or nearly complete, side surfaces 17, the n-type semiconductor film 11 will enable the device to acquire desired current capacity despite its minimal thickness.

Operation

Figure 4:
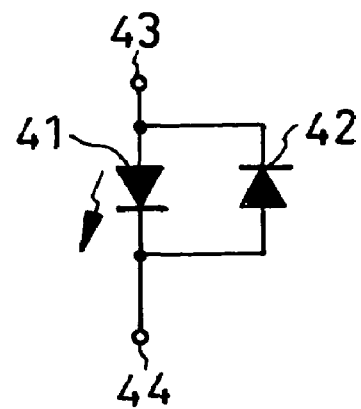
FIG. 4 is an equivalent electrical diagram of the overvoltage-protected light-emitting semiconductor device of FIG. 1.

As equivalently electrically diagrammed in FIG. 4, the overvoltage-protected light-emitting semiconductor device of the foregoing mechanical and chemical design is, electrically, a reversely parallel connection of an LED 41 and an overvoltage protector diode 42. The LED 41 is formed by the LED section 1 of the FIG. 1 device, and the protector diode 42 by the overvoltage protector section 2. The electrodes 8 and 9 of the FIG. 1 device are equivalent to the terminals 43 and 44 of the FIG. 4 circuit.

The forward voltage, or forward conduction-initiating voltage, of the protector diode 42 is set less than the maximum allowable reverse voltage of the LED 41. The forward voltage of the protector diode 42 should desirably be higher than the normal reverse voltage of the LED 41. The protector diode 42 will conduct upon application of an excessive reverse voltage to the LED 41, with the result that the voltage across the LED is kept at the forward voltage of the protector diode 42. Thus is the LED 41 saved from reverse voltage spikes or surges and from consequent destruction or severe weakening.

Alternatively, a zener diode or like constant voltage diode is adoptable as the overvoltage protector diode 42. Such a constant voltage diode should have a reverse breakdown voltage intermediate the normal forward voltage and maximum allowable forward voltage of the LED 41. The LED 41 will then be protected against forward overvoltages by being saved from the application of voltages in excess of the reverse breakdown voltage of the constant voltage diode. The forward voltage of the constant voltage diode may be equal to that of the protector diode 42.

The constant voltage diode is capable of protecting the LED 41 from both forward and reverse overvoltages. In applications where the LED 41 need not be protected from reverse overvoltages, the constant voltage diode may then have its forward voltage determined arbitrarily and used solely for protection of the LED 41 from forward overvoltages.

The advantages offered by the overvoltage-protected light-emitting semiconductor device, set forth hereinbefore with reference to FIGS. 1-4, may be recapitulated as follows:

1. The light-generating semiconductor region 7 of the LED occupies no less percentage of the available surface 13 of the substrate 3 than in the absence of the overvoltage protector section 2, because the protector section 2 is partly formed on the slanting side surfaces 17 of the light-generating semiconductor region 7 and makes utmost use of the marginal portion 32 of the substrate 3 which is left unused by the LED. The overvoltage-protected LED according to the invention can therefore be made less in size than its conventional counterpart for providing optical output of given intensity and, if made in the same size therewith, can provide optical output of greater intensity.
2. The n-type semiconductor layer 11 of the overvoltage protector section 2 lies inwardly of the substrate 3, as seen in a plan view as in FIG. 2, thanks to the marginal portion of the substrate and the truncated pyramidal shape of the light-generating semiconductor region 7. Thus the overvoltage-protected LED according to the invention is substantially no less compact than its unprotected counterpart.
3. The parallel connection of the LED 41 and protector diode 42 as in FIG. 4 is easy to realize in the actual mechanical construction of the overvoltage-protected LED depicted in FIG. 1 because the LED section 1 and protector section 2 share the substrate 3 and because the n-type semiconductor film 11 of the protector section directly engages the top electrode 8. The overvoltage-protected LED of FIG. 1 is thus designed with due considerations to the simplicity and compactness of construction, ease of production, and manufacturing costs.
4. The fabrication of the overvoltage protector section 2 is easy and inexpensive particularly because its n-type semiconductor film 11 can be created by physical or chemical vapor deposition, sputtering, or screenprinting, which are all very productive, economic processes.
5. The insulating film 10, n-type semiconductor film 11 and protective covering 12 are all transparent, permitting the light to issue from the slanting sides 17 of the light-generating semiconductor region 7 for a higher efficiency of light emission.

Embodiment of FIG. 5

The second preferred form of overvoltage-protected LED shown in FIG. 5 differs from the FIG. 1 embodiment only in its overvoltage protector section $2_a$. The modified protector section $2_a$ differs in turn from its FIG. 1 counterpart only in the absence of the insulating film 10.

As a result of the absence of the insulating film 10, the n-type semiconductor film 11 of the modified protector section $2_a$ is directly held against the slanting side surfaces 17 of the light-generating semiconductor region 7. The n-type semiconductor film 11 may therefore be made from a material that is greater in bandgap than that of the active layer 5, preferably than those of all the constituent layers 4-6 of the light-generating semiconductor region 7. Possible current leakage from semiconductor film 11 to light-generating semiconductor region 7, or vice versa, will then be practically negligible. The other details of construction and operation as well as the resulting advantages are as stated above in connection with the FIG. 1 embodiment.

Figure 6:
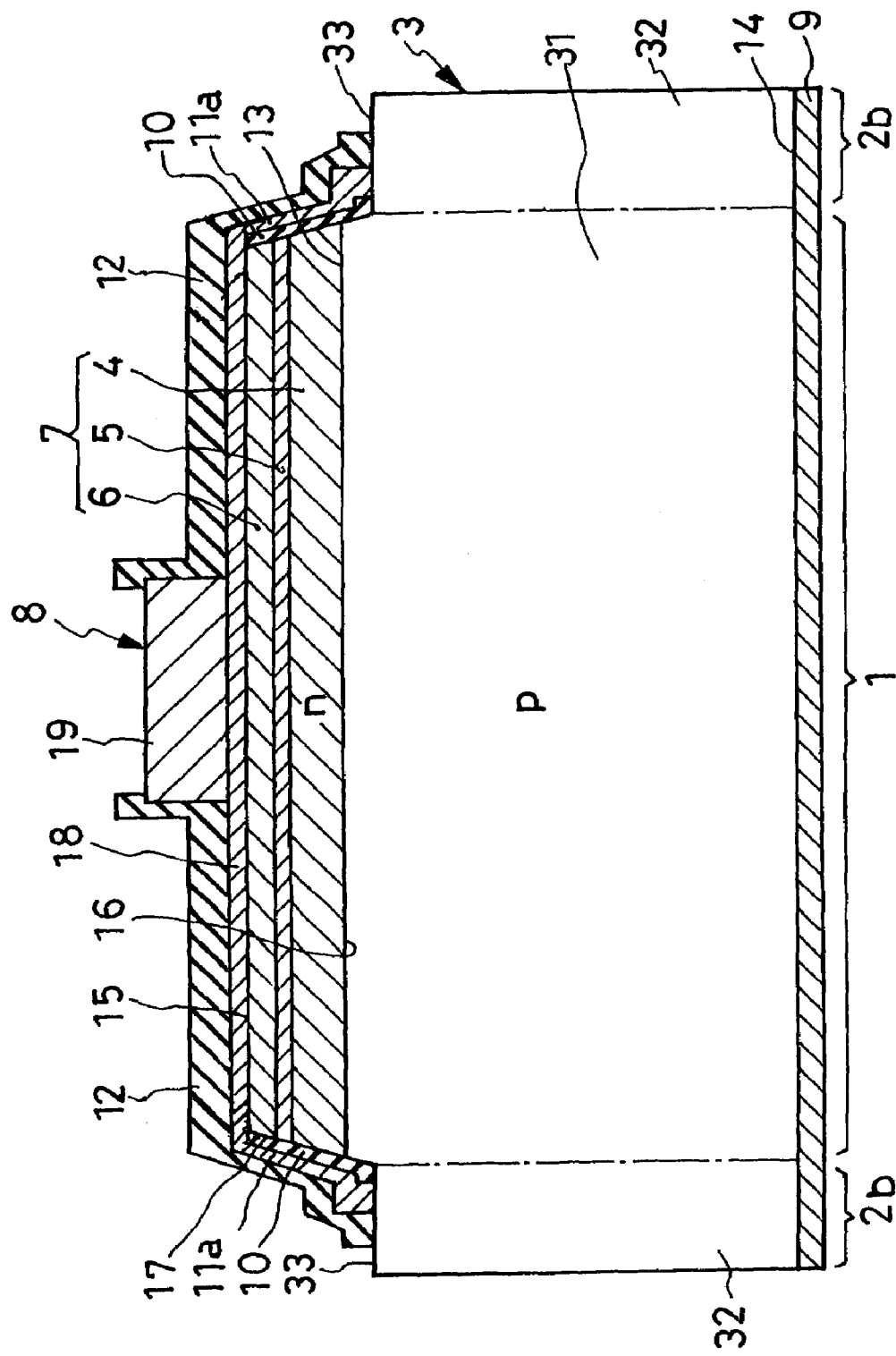
FIG. 6 is a section through a further preferred form of overvoltage-protected light-emitting semiconductor device according to the invention.

Embodiment of FIG. 6

FIG. 6 shows another modified overvoltage protector section $2_b$ as incorporated with the LED section 1 of the same construction as that of FIG. 1. The modified protector section $2_b$ is akin in construction to its FIG. 1 counterpart except that its n-type semiconductor film $11_a$ is of the same material (e.g. ITO) as that of the transparent overlay 18 of the top electrode 8.

Being of the same material, the n-type semiconductor film $11_a$ of the protector section $2_b$ and the transparent overlay 18 of the top electrode 8 are capable of joint, one-piece fabrication in the same manufacturing step, as will become apparent from a closer inspection of FIG. 6. The transparent overlay 18 in the form of an n-type semiconductor film will present no practical problem because of a relatively low barrier between it and the p-type semiconductor layer 6.

Thus the FIG. 6 embodiments gains the advantage of greater ease and simplicity of manufacture, in addition to all those described in conjunction with the FIG. 1 embodiment. The production of this FIG. 6 embodiment will become even easier if the insulating film 10 is omitted as in the FIG. 5 embodiment.

Figure 7:
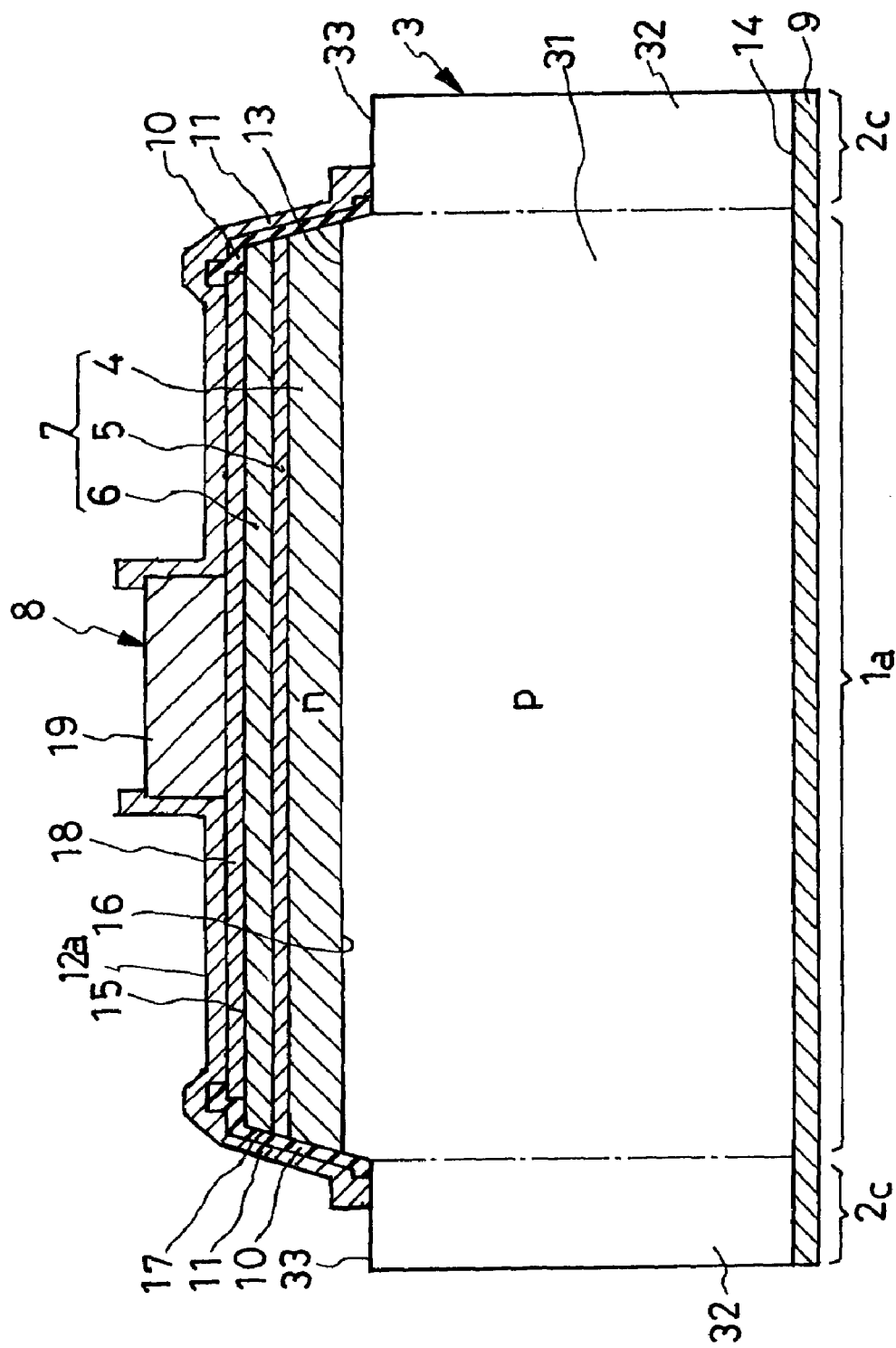
FIG. 7 is a section through a further preferred form of overvoltage-protected light-emitting semiconductor device according to the invention.

Embodiment of FIG. 7

This embodiment contains modifications in both of its LED section $1_a$ and overvoltage protector section $2_c$. The modified LED section $1_a$ features a protective covering $12_a$ of one-piece construction with the transparent n-type semiconductor film 11, as distinguished from the protective covering 12 of the FIG. 1 embodiment which is separate from the semiconductor film 11. The protector section $2_c$ likewise differs from its FIG. 1 counterpart 2 only in the absence of the discrete protective covering 12.

Just as the n-type semiconductor film $11_a$ of the protector section $2_b$ and the transparent overlay 18 of the top electrode 8 are capable of joint fabrication in the FIG. 6 embodiment, so are, in this FIG. 7 embodiment, the protective covering $12_a$ and the n-type semiconductor film 11 of the protector section 2.

Figure 8:
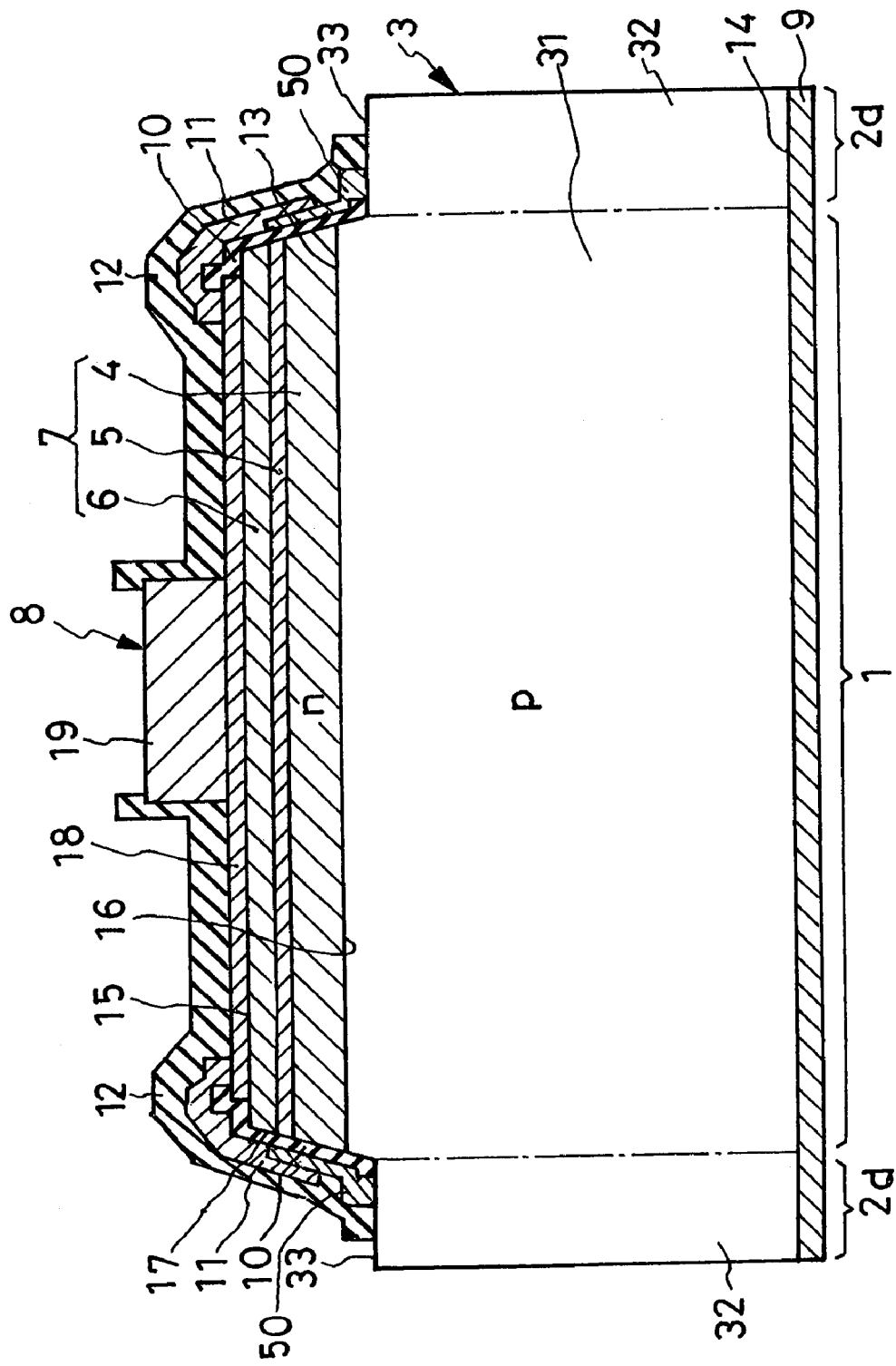
FIG. 8 is a section through a further preferred form of overvoltage-protected light-emitting semiconductor device according to the invention.

Embodiment of FIG. 8

In FIG. 8 is shown a further preferred form of overvoltage-protected LED according to the invention which includes a modified protector section $2_d$. The modified protector section $2_d$ is analogous with its FIG. 1 counterpart 2 except for the addition of a p-type semiconductor film 50, which can be made from any such material as amorphous silicon, NiO, $Cu_2O$, FeO, $CuAlO_2$, $CuGaO_2$, or $SrCu_2O_2$.

Extending annularly around the slanting side surfaces 17 of the light-generating semiconductor region 7 and held against the insulating film 10, the p-type semiconductor film 50 is placed edgewise against the marginal portion 32 of the substrate 3 in low-resistance electrical contact therewith. The addition of the p-type semiconductor film 50 has caused a slight modification in the n-type semiconductor film 11, which is in pn contact with the p-type semiconductor film 50 along one longitudinal edge thereof. The n-type semiconductor film 11 is otherwise similar to that of FIG. 1, being mostly held against the slanting side surfaces 17 of the light-generating semiconductor region 7 via the insulating film 10 and, along the other longitudinal edge thereof, in low-resistance contact with the transparent overlay 18 of the top electrode 8. The protective covering 12 covers both n-type semiconductor film 11 and p-type semiconductor film 50, in addition to most of the top electrode 8.

Such being the construction of the FIG. 8 embodiment, the pn junction between p-type semiconductor film 50 and n-type semiconductor film 11 provides a pn-junction diode which functions as the desired protector diode 42 in the equivalent electrical diagram of FIG. 4. The FIG. 8 embodiment may additionally incorporate the teachings of the foregoing embodiments of the invention, such as the omission of the insulating film 10 as in FIG. 5, the one-piece construction of the n-type semiconductor film $11_a$ and the transparent overlay 18 as in FIG. 6, and the one-piece construction of the n-type semiconductor film 11 and protective covering $12_a$ as in FIG. 7.

Figure 9:
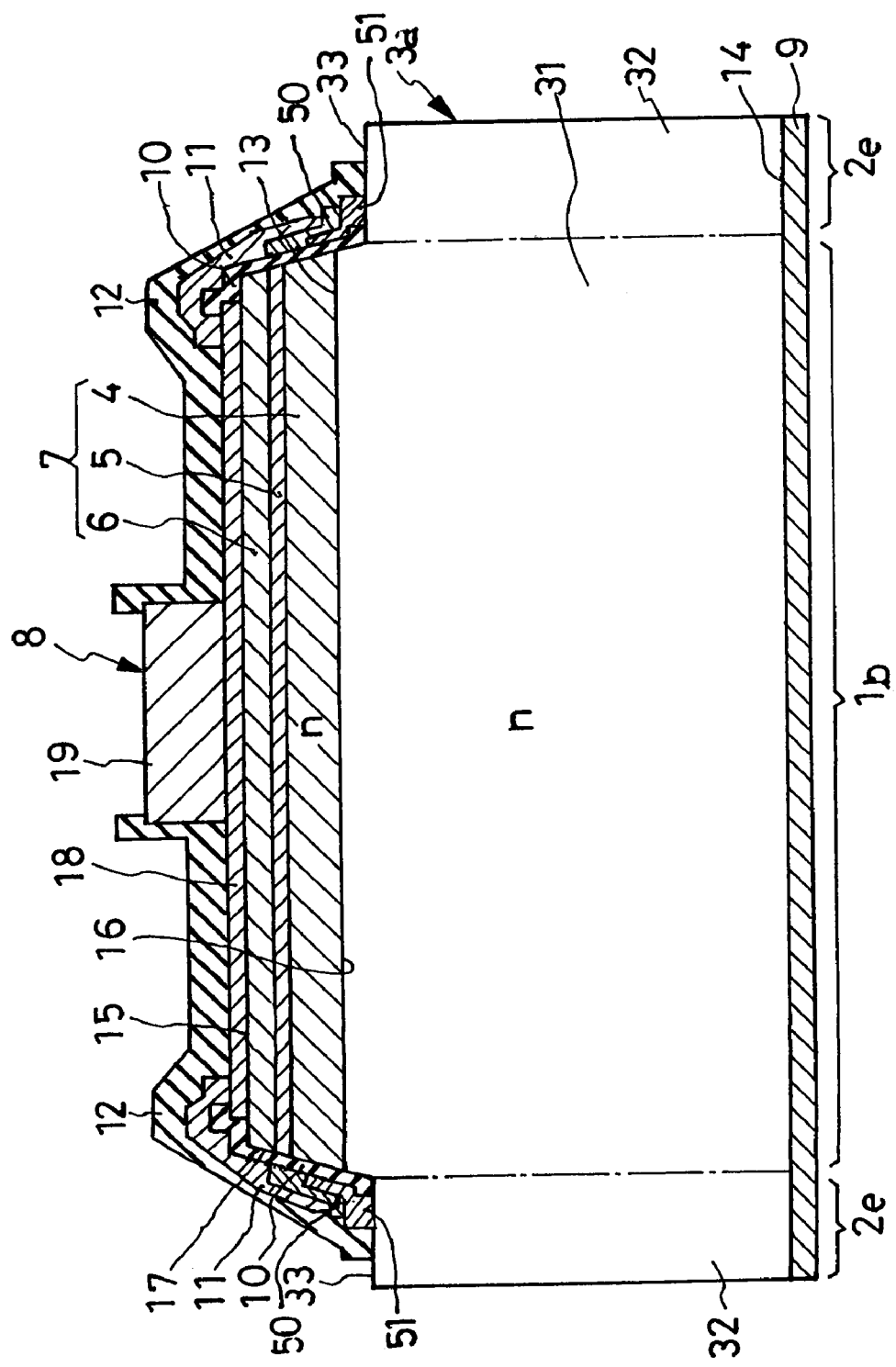
FIG. 9 is a section through a further preferred form of overvoltage-protected light-emitting semiconductor device according to the invention.

Embodiment of FIG. 9

A further preferred form of overvoltage-protected LED in FIG. 9 includes modifications in both of its LED section $1_b$ and overvoltage protector section $2_e$. The modified LED section $1_b$ has a substrate $3_a$ of an n-type silicon semiconductor, instead of a p-type one as in all the preceding embodiments, but is otherwise identical with its FIG. 1 counterpart 1. The modified protector section $2_e$ is similar to its FIG. 8 counterpart $2_d$ in having the p-type semiconductor film 50 but additionally incorporates a metal layer 51 of annular shape. The metal layer 51 is held in part against the depressed surface 33 of the marginal portion 32 of the semiconductor substrate $3_a$ and in part against the slanting side surfaces 17 of the light-generating semiconductor region 7 via the insulating film 10.

The p-type semiconductor layer 50 of the modified protector section $2_e$ is in part held against the slanting side surfaces 17 of the light-generating semiconductor region 7 via the insulating film 10 and in part makes low-resistance engagement with the metal layer 51. As in FIG. 8, the n-type semiconductor film 11 of the modified protector section $2_e$, has one longitudinal edge portion in pn contact with the p-type semiconductor film 50 and another longitudinal edge portion in low-resistance electrical contact with the transparent overlay 18 of the top electrode 8.

This FIG. 9 embodiment obtains the same advantages as does the FIG. 8 embodiment, being equivalent thereto except for the addition of the metal layer 51. The substrate conductivity is switched from p to n type in this embodiment because of the use of the metal layer 51 in contact with its marginal portion 32. However, the substrate $3_a$ could be of p-type conductivity as in all the foregoing embodiments because its conductivity type is not determined by the p-type semiconductor film 50 in this embodiment.

The FIG. 9 embodiment may also additionally incorporate some features of the foregoing embodiments of the invention, such as the omission of the insulating film 10 as in FIG. 5, the one-piece construction of the n-type semiconductor film $11_a$ and the transparent overlay 18 as in FIG. 6, or the one-piece construction of the n-type semiconductor film 11 and protective covering $12_a$ as in FIG. 7.

Figure 10:
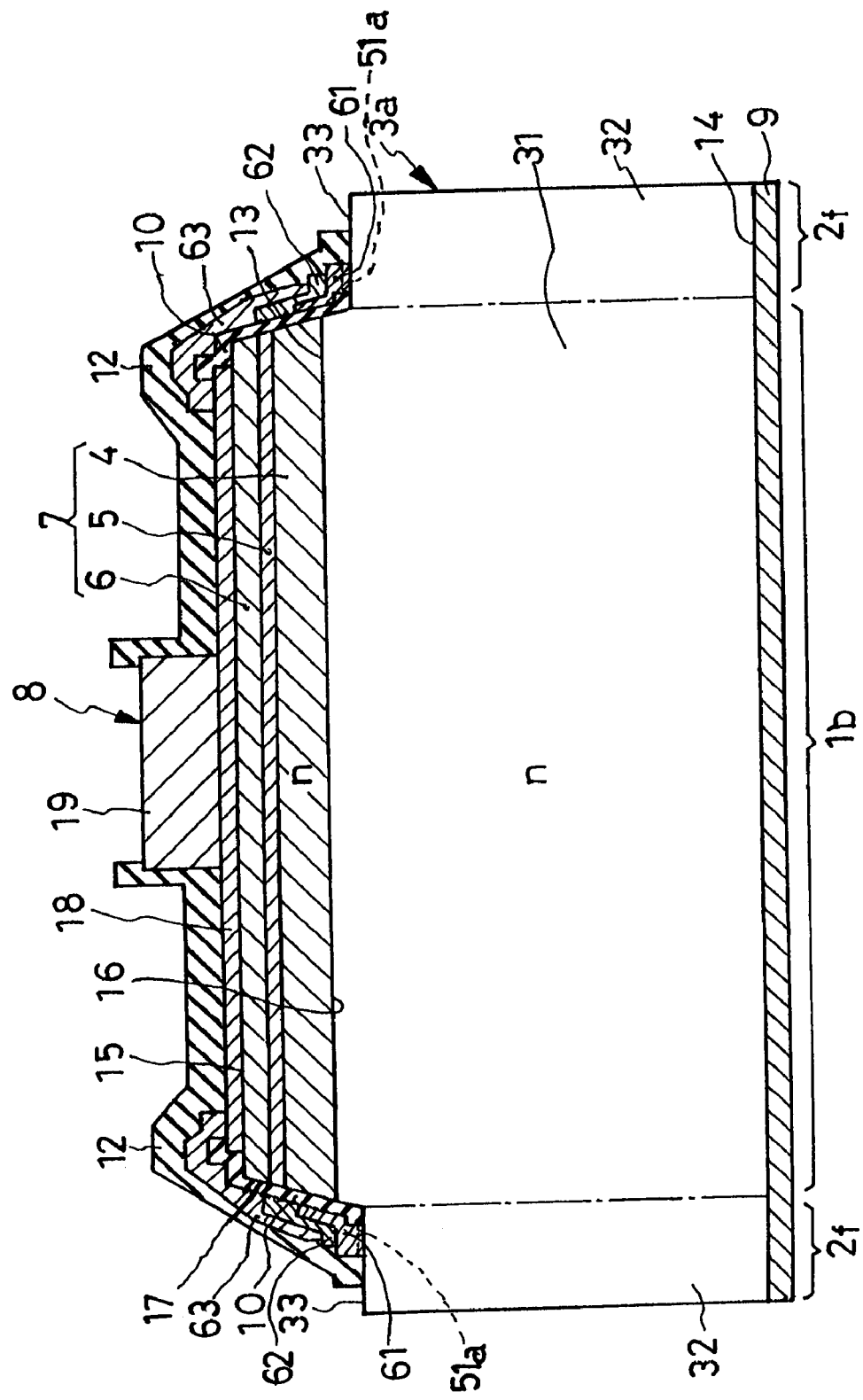
FIG. 10 is a section through a further preferred form of overvoltage-protected light-emitting semiconductor device according to the invention.

Embodiment of FIG. 10

In a further preferred form of overvoltage-protected LED shown in FIG. 10, the LED section $1_b$ of the FIG. 9 embodiment, which has the n-type silicon semiconductor substrate $3_a$, is combined with a modified overvoltage protector section $2_f$. The modified protector section $2_f$ features an n-type semiconductor film 61, a p-type semiconductor film 62, and another n-type semiconductor film 63, all of annular shape surrounding the light-generating semiconductor region 7 of the LED section $1_b$.

The n-type semiconductor film 61 has one longitudinal edge portion held directly against the n-type silicon semiconductor substrate $3_a$, and another longitudinal edge portion held against the slanting side surfaces 17 of the light-generating semiconductor region 7 via the insulating film 10. This n-type semiconductor film 61, as well as the other n-type semiconductor film 63, is made from the same material, and by the same method, as is the n-type semiconductor film 11, FIG. 1. The p-type semiconductor film 62 is in part held against the n-type semiconductor film 61 in pn contact therewith and in part against the slanting side surfaces 17 of the light-generating semiconductor region 7 via the insulating film 10. This p-type semiconductor film 62 is made from the same material, and by the same method, as is the p-type semiconductor film 50, FIGS. 8 and 9. The other n-type semiconductor film 63 is held in part against the p-type semiconductor film 62 in pn contact therewith and in part against the transparent overlay 18 of the top electrode 8 in electrical contact therewith. All placed against the slanting side surfaces 17 of the light-generating semiconductor region 7 and lapping one over another, the three semiconductor films 61-63 constitute in combination an npn diode for overvoltage protection.

Figure 11:
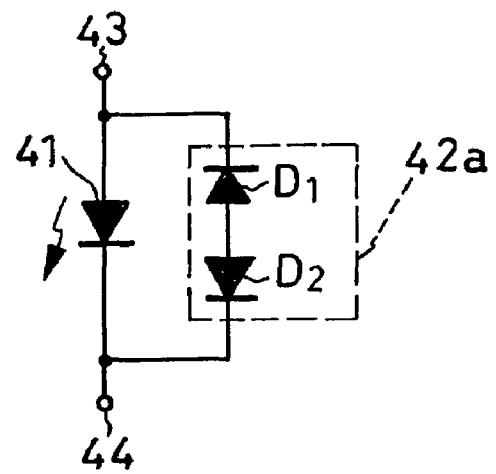
FIG. 11 is an equivalent electrical diagram of the device of FIG. 10.

Reference may be had to FIG. 11 for an equivalent electrical diagram of the overvoltage-protected LED of FIG. 10. The LED 41 in this diagram corresponds to the LED section $1_b$ of the FIG. 10 embodiment, the npn diode $42_a$ to the protector section $2_f$, and the terminals 43 and 44 to the electrodes 8 and 9.

Commonly known as the diac, the npn diode $42_a$ is a bidirectional trigger diode which may be envisaged as a serial connection of a first diode $D_1$, oriented reversely with respect to the LED 41, and a second diode $D_2$ oriented forwardly with respect to the same. The diac symbol is sometimes shown as a parallel connection of two oppositely oriented diodes. The npn diode $42_a$ has its forward and reverse breakdown voltages determined just like the constant voltage diode explained with reference to FIG. 4. The reverse breakdown voltage of the npn diode $42_a$ should be less than the maximum allowable reverse voltage of the LED 41 and higher than the normal reverse voltage of the LED. The forward breakdown voltage on the other hand should be intermediate the normal forward voltage and maximum allowable forward voltage of the LED 41. Thus, having its maximum voltage limited by the npn diode $42_a$, the LED 41 is protected from both forward and reverse overvoltages.

Having the protector section $2_f$ similar to its FIG. 1 counterpart 2, the FIG. 10 embodiment possesses the same advantages as does that of FIG. 1. The FIG. 10 embodiment may also additionally incorporate such features of the foregoing embodiments as the omission of the insulating film 10 as in FIG. 5, the one-piece construction of the n-type semiconductor film 63 and the transparent overlay 18 as in FIG. 6, and the one-piece construction of the n-type semiconductor film 63 and protective covering $12_a$ as in FIG. 7. An additional possible modification of the FIG. 10 embodiment is the interposition of a metal layer between substrate $3_a$ and n-type semiconductor film 61, as indicated by the dashed line in FIG. 10 and labeled $51_a$. The substrate $3_a$ can then be of the same type of conductivity, p, as the FIG. 1 substrate 3.

Figure 12:
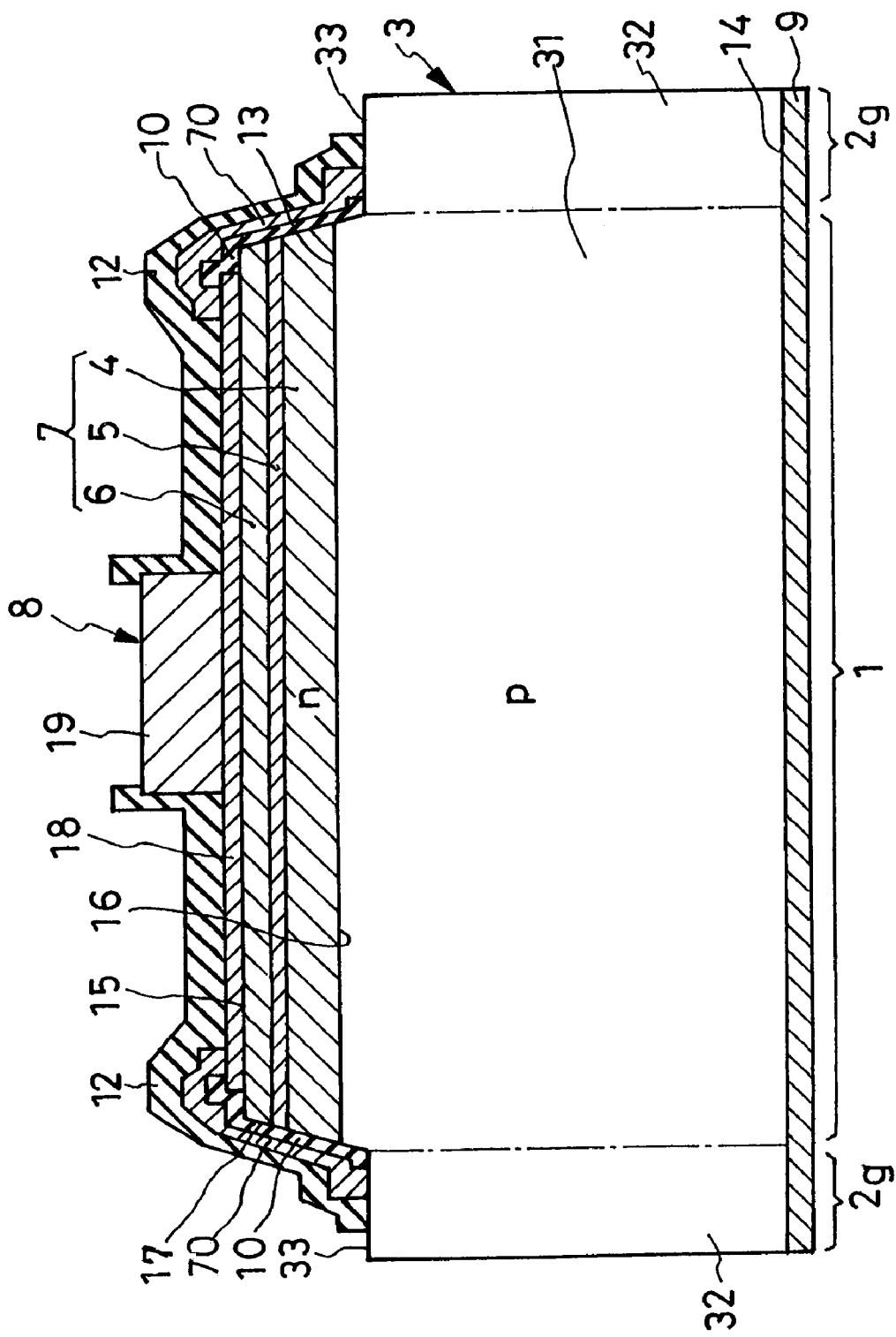
FIG. 12 is a section through a further preferred form of overvoltage-protected light-emitting semiconductor device according to the invention.

Embodiment of FIG. 12

This embodiment is a combination of the LED section 1 of the same construction as in FIG. 1 and a modified overvoltage protector section $2_g$. The modified protector section $2_g$ differs from its FIG. 1 counterpart 2 only in a metal film 70 employed in substitution for the n-type semiconductor film 11, FIG. 12, to provide a Schottky diode. Annular in shape, the metal film 70 extends around the light-generating semiconductor region 7 and is held against its slanting side surfaces 17 via the insulating film 10. One longitudinal edge of the metal film 70 overlies the annular ledge 33 of the marginal portion 32 of the substrate 3, and the other longitudinal edge thereof joined to the transparent overlay 18 of the top electrode 8.

The metal film 70 makes Schottky contact with the p-type substrate 3 and so provides a Schottky diode in combination therewith. The metal film 70 may be made from any such material as Ti, Pt, Cr, Al, Sm, PtSi, or Pd$_2$Si. The Schottky diode thus created is similar in function to the pn-junction diode 42, FIG. 4, and is connected reversely in parallel with the LED 41. Thus the FIG. 12 embodiment achieves all the advantages of the FIG. 1 embodiment.

Figure 13:
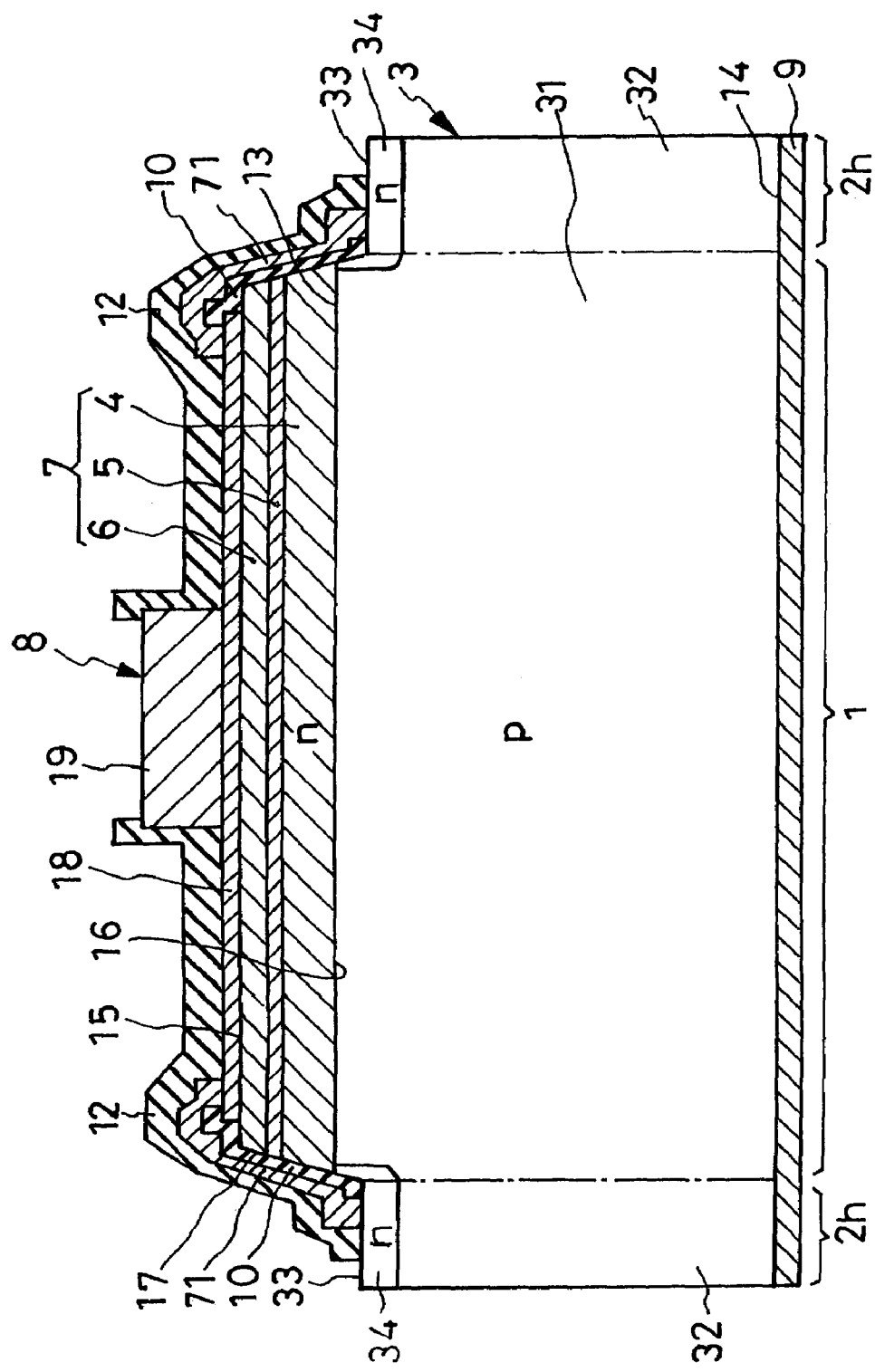
FIG. 13 is a section through a further preferred form of overvoltage-protected light-emitting semiconductor device according to the invention.

Embodiment of FIG. 13

This embodiment is also a combination of the LED section 1, FIG. 1, and a modified overvoltage protector section $2_h$. The modified protector section $2_h$ features an n-type semiconductor region 34 formed annularly in the marginal portion 32 of the p-type semiconductor substrate 3 to a certain depth from the surface of its ledge 33. The n-type semiconductor region 34 is electrically coupled to the transparent overlay 18 of the top electrode 8 via an annular metal film 71 which is held against the slanting side surfaces 17 of the light-generating semiconductor region 7 via the insulating film 10. FIG. 13 depicts the n-type semiconductor region 34 as slightly intruding into the main portion 31 of the substrate 3. Such intrusion is merely an incidental result of the creation of the n-type semiconductor region 34 in the p-type semiconductor substrate 3 and not an essential feature of the invention. The n-type semiconductor region 34 may instead be wholly contained in the marginal portion 32 of the substrate 3. The annular metal film 71 has one of its opposite longitudinal edges in low-resistance contact with the n-type semiconductor region 34 and the other longitudinal edge in low-resistance contact with the transparent overlay 18 of the top electrode 8.

Thus the p-type semiconductor substrate 3 and n-type semiconductor region 34 provide in combination a pn-junction diode which is functionally equivalent to the protector diode 42, FIG. 4, protecting the LED section 1 from overvoltages.

It will be appreciated that the protector diode of this embodiment does not necessitate an increase in the size of the overvoltage-protected LED. The metal film 71, a part of the protector section 2, is placed against the slanting side surfaces 17 of the light-generating semiconductor region 7 via the insulating film 10, and the n-type semiconductor region 34 of the protector diode is formed in part of the marginal portion 32 of the substrate 3 which does not take part in light emission. As a consequence, for a given area of the light-emitting surface 15 of the light-generating semiconductor region 7, the complete overvoltage-protected LED can be made less in size than heretofore. As has been explained with reference to FIG. 3, the marginal portion 32 of the substrate 3 is a preexisting part of the conventional non-overvoltage-protected LED. The n-type semiconductor region 34 has often been created for terminating or retarding the progress of the etching of the layers 4-6 of the light-generating semiconductor regions formed over the complete wafer surface. Thus the creation of the protector pn-junction diode on and in the marginal portion 32 of the substrate 3 does not add to the size of the LED. The FIG. 13 embodiment attains the same objects as does that of FIG. 1.

Figure 14:
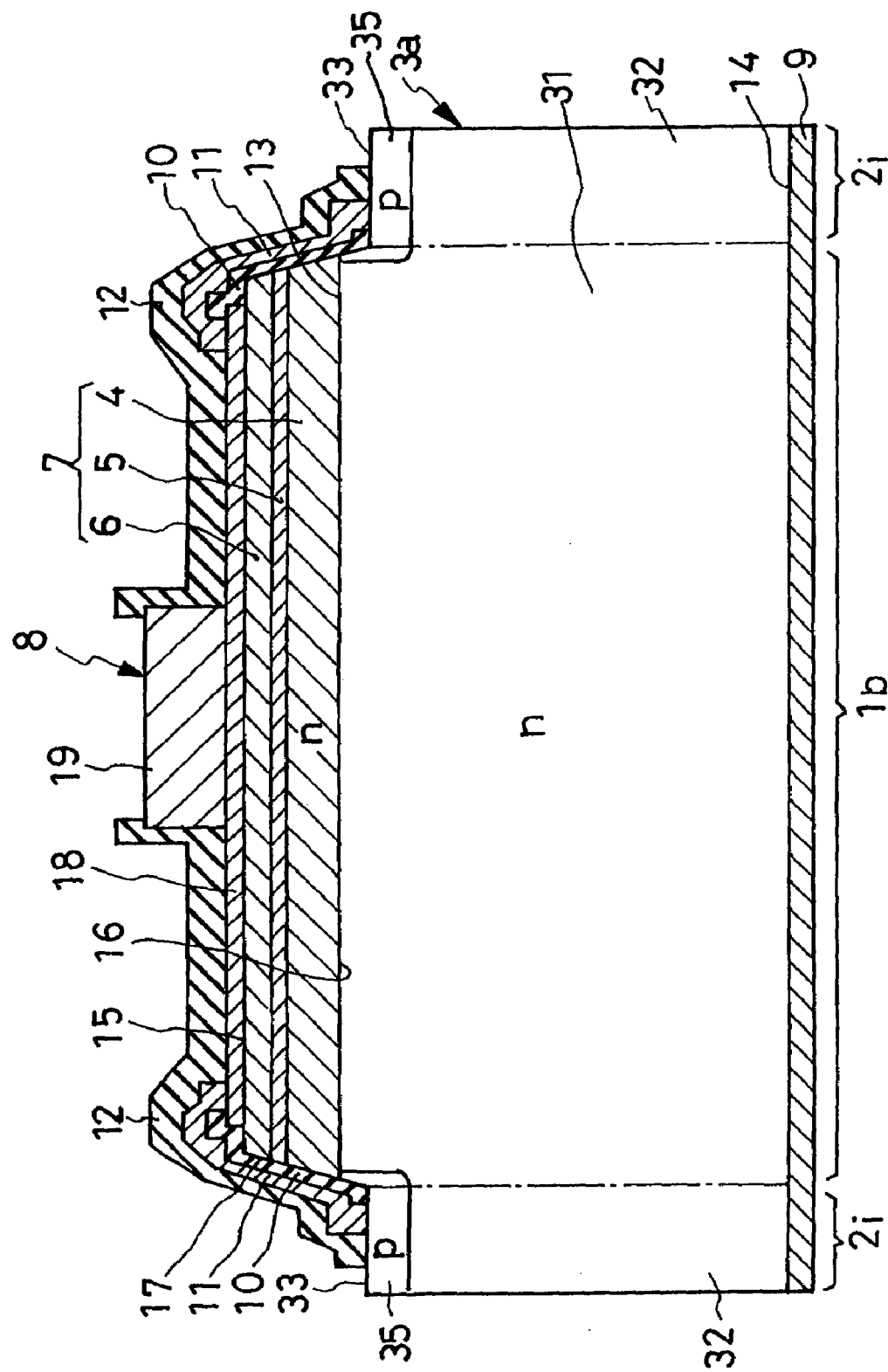
FIG. 14 is a section through a further preferred form of overvoltage-protected light-emitting semiconductor device according to the invention.

Embodiment of FIG. 14

The overvoltage-protected LED shown here incorporates modifications in both of its LED section $1_b$ and overvoltage protector section $2_i$. The modified LED section $1_b$ differs from its FIG. 1 counterpart 1 only in having a silicon semiconductor substrate $3_a$ of n-type conductivity. The modified protector section $2_h$ features a p-type semiconductor region 35 formed annularly in the marginal portion 32 of the n-type semiconductor substrate $3_a$ to a certain depth from the surface of its ledge 33. Here again the depiction of the p-type semiconductor region 35 as partially intruding into the main portion 31 of the substrate $3_a$ should not be taken as a necessity; instead, the region 35 could be wholly contained in the marginal portion 32 of the substrate $3_a$. All the other details of construction of the protector section $2_i$ are as stated above in connection with the FIG. 1 embodiment.

The p-type semiconductor region 35 is electrically coupled to the transparent overlay 18 of the top electrode 8 via the annular n-type semiconductor film 11 which is held against the slanting side surfaces 17 of the light-generating semiconductor region 7 via the insulating film 10. The semiconductor film 11 has one of its opposite longitudinal edges in pn-contact with the p-type semiconductor region 35 and the other longitudinal edge in contact with the transparent overlay 18 of the top electrode 8.

Thus the overvoltage-protected LED of FIG. 14 is electrically configured as equivalently diagramed in FIG. 11. The LED section $1_b$ provides the LED 41, and the protector section $2_i$ the npn diode $42_a$. The LED 41 and npn diode $42_a$ are connected in parallel with each other between the terminals 43 and 44 which in FIG. 14 are shown as the electrodes 8 and 9. The n-type semiconductor film 11 and p-type semiconductor region 35 provide in combination a pn-junction diode shown as $D_1$ in FIG. 11. The n-type semiconductor substrate $3_a$ and p-type semiconductor region 35 provide in combination another pn-junction diode shown as $D_2$ in FIG. 11. The diodes $D_1$ and $D_2$ constitute in combination the protector diode $42_a$. The protector diode of FIG. 14 may be constructed to possess the same characteristics as those stated above with reference to FIG. 11, for protecting the LED from overvoltages just like the protector diode of FIG. 10.

The other advantages of this FIG. 14 embodiment are as enumerated above in connection with that of FIG. 1. The FIG. 14 embodiment may also additionally incorporate such features of the foregoing embodiments as the omission of the insulating film 10 as in FIG. 5, the one-piece construction of the n-type semiconductor film 11 and the transparent overlay 18 of the top electrode 8 as in FIG. 6, and the one-piece construction of the n-type semiconductor film 11 and protective covering 12 as in FIG. 7.

Figure 15:
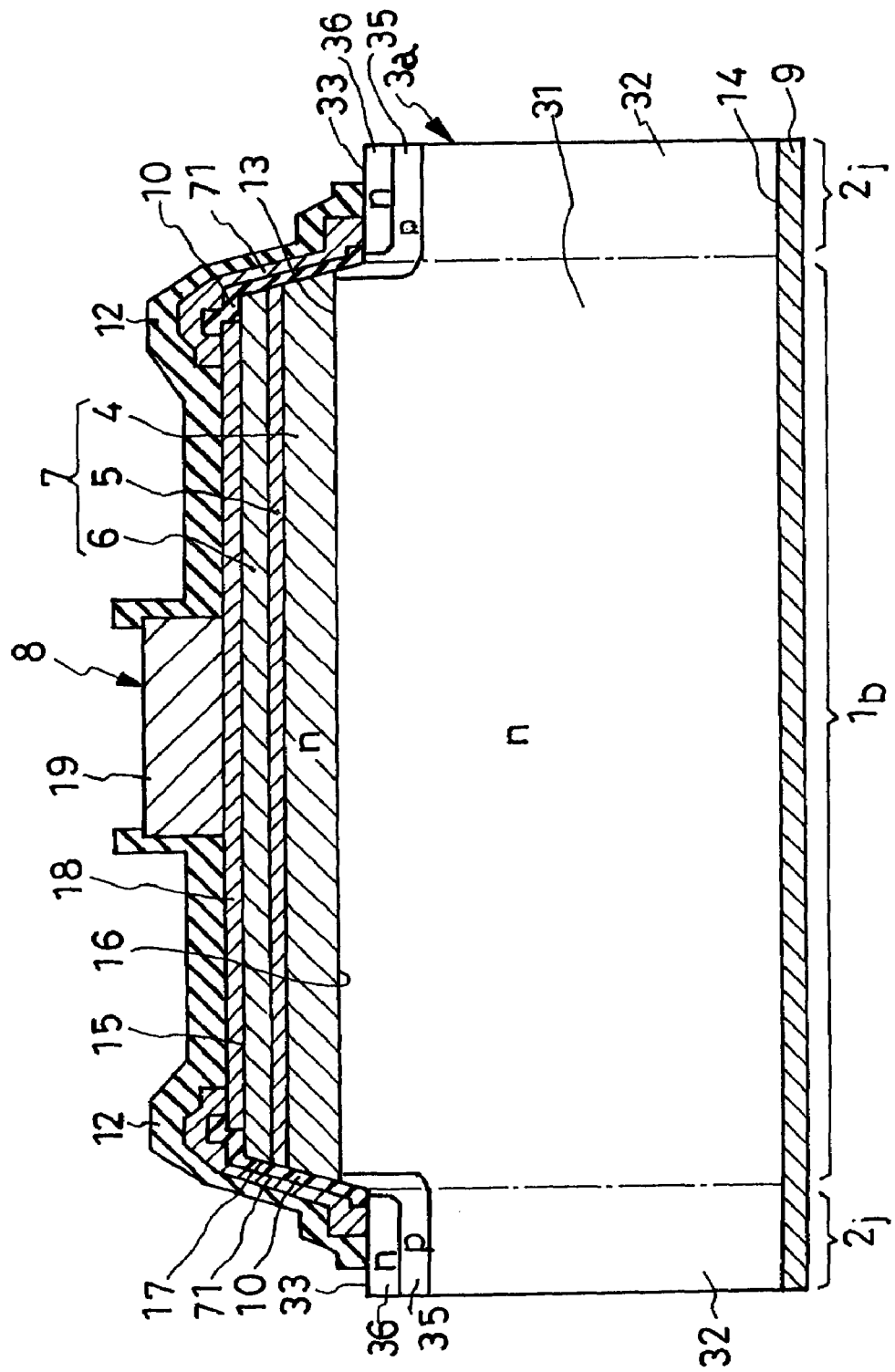
FIG. 15 is a section through a further preferred form of overvoltage-protected light-emitting semiconductor device according to the invention.

Embodiment of FIG. 15

The embodiment of FIG. 15 also includes modifications in both LED section $1_b$ and overvoltage protector section $2_j$. The modified LED section $1_b$ differs from its FIG. 1 counterpart 1 only in having a silicon semiconductor substrate $3_a$ of n-type conductivity. The modified protector section $2_j$ features an p-type semiconductor region 35 and n-type semiconductor region 36, both formed annularly in the marginal portion 32 of the n-type semiconductor substrate $3_a$. The n-type semiconductor region 36 extends to a certain depth from the surface of the substrate ledge 33, and the p-type semiconductor region 35 lies thereunder. A pn junction exists between p-type semiconductor region 35 and n-type semiconductor substrate $3_a$, and another pn junction between p-type semiconductor region 35 and n-type semiconductor region 36.

The n-type semiconductor region 36 is electrically coupled to the transparent overlay 18 of the top electrode 8 via an annular metal film 71 which is held against the slanting side surfaces 17 of the light-generating semiconductor region 7 via the insulating film 10. The annular metal film 71 has one of its opposite longitudinal edges in low-resistance contact with the n-type semiconductor region 36 and the other longitudinal edge in low-resistance contact with the transparent overlay 18 of the top electrode 8.

Having two pn junctions between the electrodes 8 and 9, the protector section $2_j$ of FIG. 15 provides an npn diode similar to that indicated at $42_a$ in FIG. 11. Like the protector diodes of all the foregoing embodiments, the npn diode of the FIG. 15 embodiment is so arranged as not to lessen the effective light-emitting area of the LED. The p-type semiconductor region 35 is shown slightly intruding into the main portion 31 of the substrate $3_a$ but could be wholly contained in its marginal portion 32. It would pose no problem, either, if the n-type semiconductor region 36 partly intrudes into the main portion 31.

Figure 16:
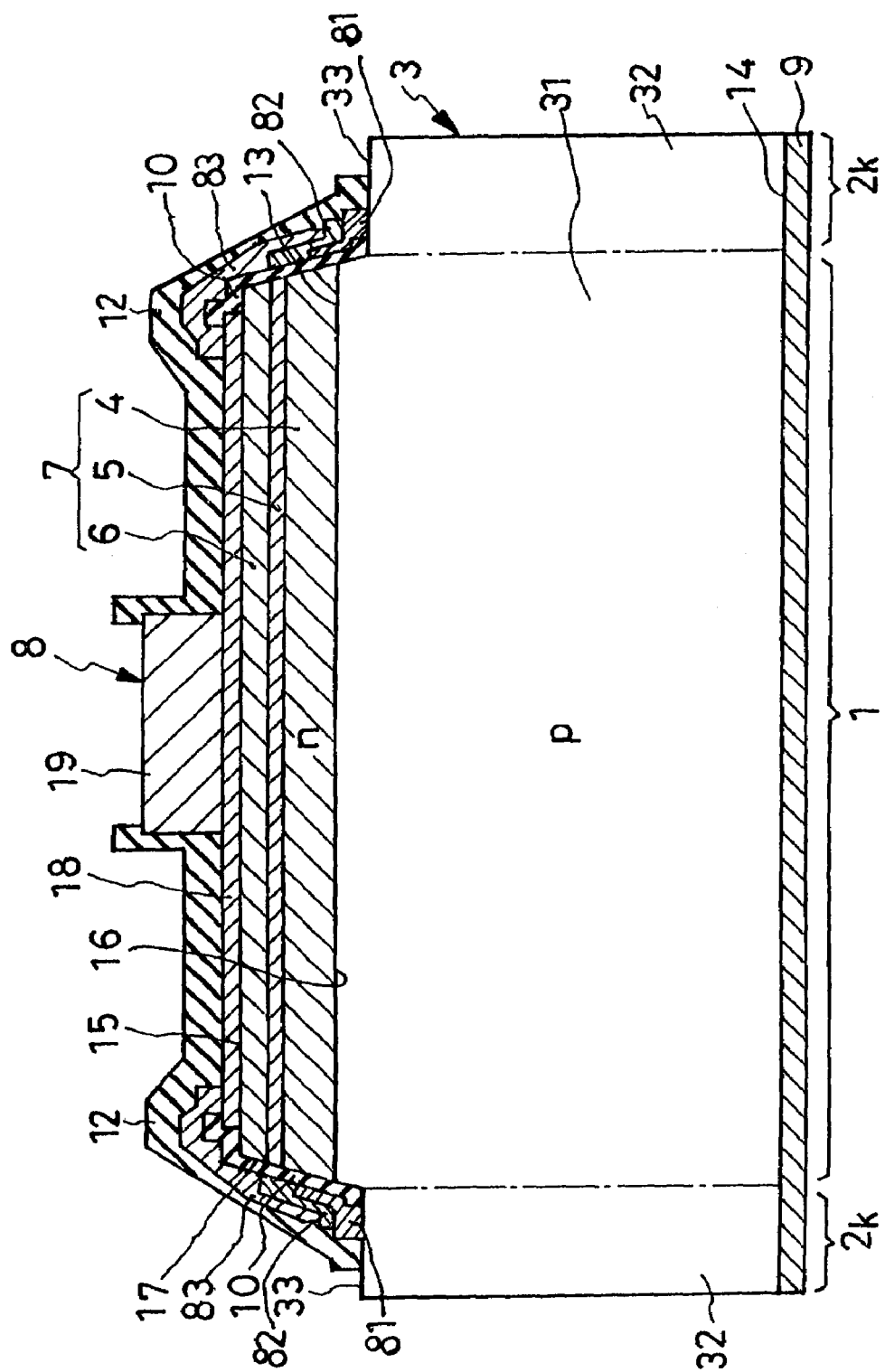
FIG. 16 is a section through a further preferred form of overvoltage-protected light-emitting semiconductor device according to the invention.

Embodiment of FIG. 16

The overvoltage-protected LED of FIG. 16 is a combination of the LED section 1 of the same construction as that of FIG. 1 and a modified overvoltage protector section $2_k$. The modified protector section $2_k$ is designed to provide an overvoltage protector capable of functioning both as varistor and capacitor. To this end the modified protector section $2_k$ has a dielectric layer 82 of annular shape made from a semiconducting ceramic of a known composition, and first and second metal layers 81 and 83 of annular shape on opposite sides of the dielectric layer 82, all surrounding the light-generating semiconductor region 7 of the LED section 1. The first metal layer 81 directly overlies the ledge 33 of the substrate 3 and is partly held against the slanting side surfaces 17 of the light-generating semiconductor region 7 via the insulating film 10. The dielectric layer 82 overlies the first metal layer 81. The second metal layer 83 is partly held against the dielectric layer 82 and partly against the transparent overlay 18 of the top electrode 8.

Figure 17:
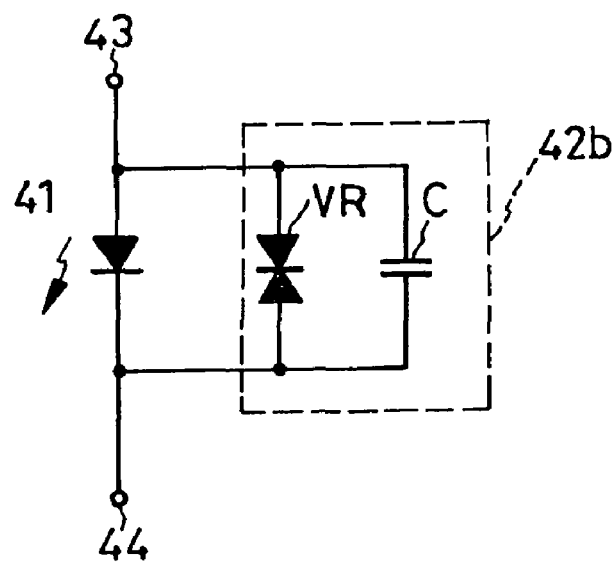
FIG. 17 is an equivalent electrical diagram of the device of FIG. 16.

FIG. 17 is an equivalent electrical diagram of this overvoltage-protected LED. The LED 41 of this diagram corresponds to the LED section 1 of the FIG. 6 embodiment, the overvoltage protector $42_b$ to the protector section $2_k$, and the terminals 43 and 44 to the electrodes 8 and 9. The overvoltage protector $42_b$ is a parallel connection of a varistor (voltage-dependent nonlinear resistor) VR and a capacitor C and is itself connected in parallel with the LED 41. The varistor VR functions as bidirectional diode like the npn diode $42_a$, FIG. 11. It is therefore desirable that the varistor VR starts conducting at the same voltage as the npn diode $42_a$. The same combination of the dielectric layer 82 and two metal layers 81 and 83 also provides the capacitor C. Connected in parallel with the LED 41, the capacitor C protects the same from overvoltages by taking up voltage surges.

The overvoltage protector of the FIG. 16 construction may function either as both varistor and capacitor, as in this embodiment, mostly as only varistor, or mostly as capacitor. Such variable functions of the overvoltage protector depend upon the choice of materials for the dielectric layer 82. The other advantages of this FIG. 16 embodiment are as recited above in connection with the FIG. 1 embodiment.

Figure 18:
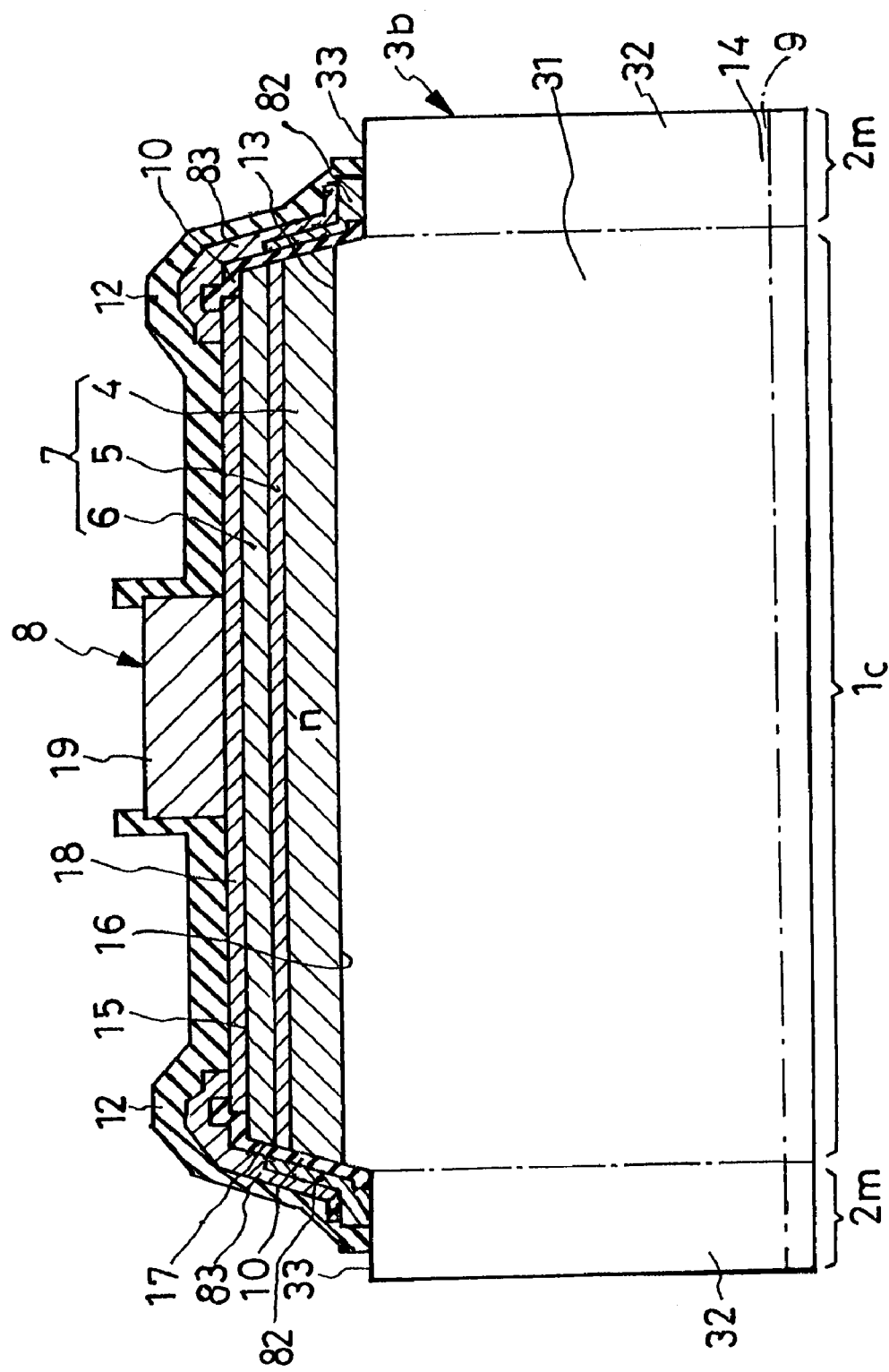
FIG. 18 is a section through a further preferred form of overvoltage-protected light-emitting semiconductor device according to the invention.

Embodiment of FIG. 18

This embodiment is a combination of a modified LED section $1_c$ and a modified overvoltage protector section $2_m$. The modified LED section $1_c$ has a metal-made substrate $3_b$ and is otherwise identical with its FIG. 1 counterpart 1.

The modified protector section $2_m$ is designed to provide an overvoltage protector similar to that offered by the protector section $2_k$ of FIG. 16, that is, the overvoltage protector $42_b$, FIG. 17, comprising both varistor VR and capacitor C. The protector section $2_m$ does not have the first metal layer 81 of the protector section $2_k$ but does have the dielectric layer 82 and the metal layer 83, with the dielectric layer placed directly on the ledge 33 of the metal-made substrate $3_b$. The omission of the first metal layer 81 is not a requirement; only, it is of no use in this embodiment. The bottom electrode 9 of this embodiment is provided by part of the metal-made substrate $3_b$, as indicated by the broken line in FIG. 18, although a separate bottom electrode could be affixed to the substrate. This embodiment gains the same advantages as do the embodiments of FIGS. 1 and 16.

Figure 19:
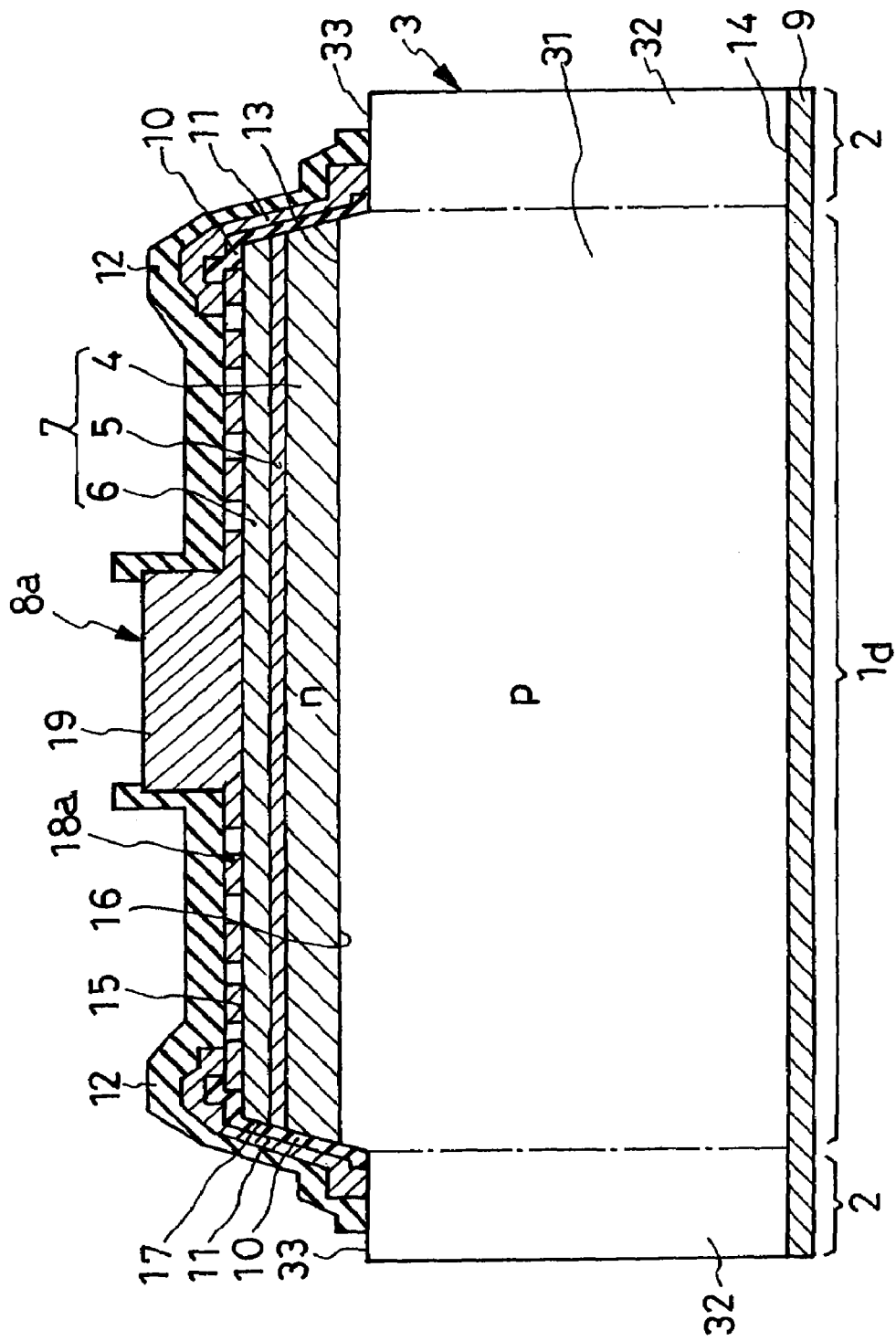
FIG. 19 is a section through a further preferred form of overvoltage-protected light-emitting semiconductor device according to the invention.

Embodiment of FIG. 19

The FIG. 19 embodiment has a modified LED section $1_d$ in combination with the overvoltage protector section 2 of the same construction as that of FIG. 1. The modified LED section $1_d$ is of the same construction as its FIG. 1 counterpart 1 except for a top electrode $8_a$. The top electrode $8_a$ differs from its FIG. 1 counterpart 8 only in having a meshed, latticed, or otherwise open-worked overlay $18_a$ in substitution for the solid, transparent overlay 18. The bonding pad 19 is placed centrally on this open-worked overlay $18_a$. The open-worked overlay $18_a$ may be made from either a transparent, or a nontransparent, conductor. Light will issue through the openings in the open-worked overlay $18_a$ if it is opaque. Like the transparent overlay 18 the open-worked overlay $18_a$ serves to spread the current toward the outer parts of the light-generating semiconductor region 7 which are out of register with the bonding pad 19. The open-worked overlay $18_a$ is electrically connected to the n-type semiconductor film 11 of the protector section 2.

The open-worked overlay $18_a$ is equivalent in function to the solid, transparent overlay 18 used in the other embodiments of the invention disclosed herein. The transparent overlay 18 of all these embodiments is therefore replaceable by the open-worked overlay $18_a$ without alteration of the other parts of the devices and without loss or diminution of all their inherent advantages.

Figure 20:
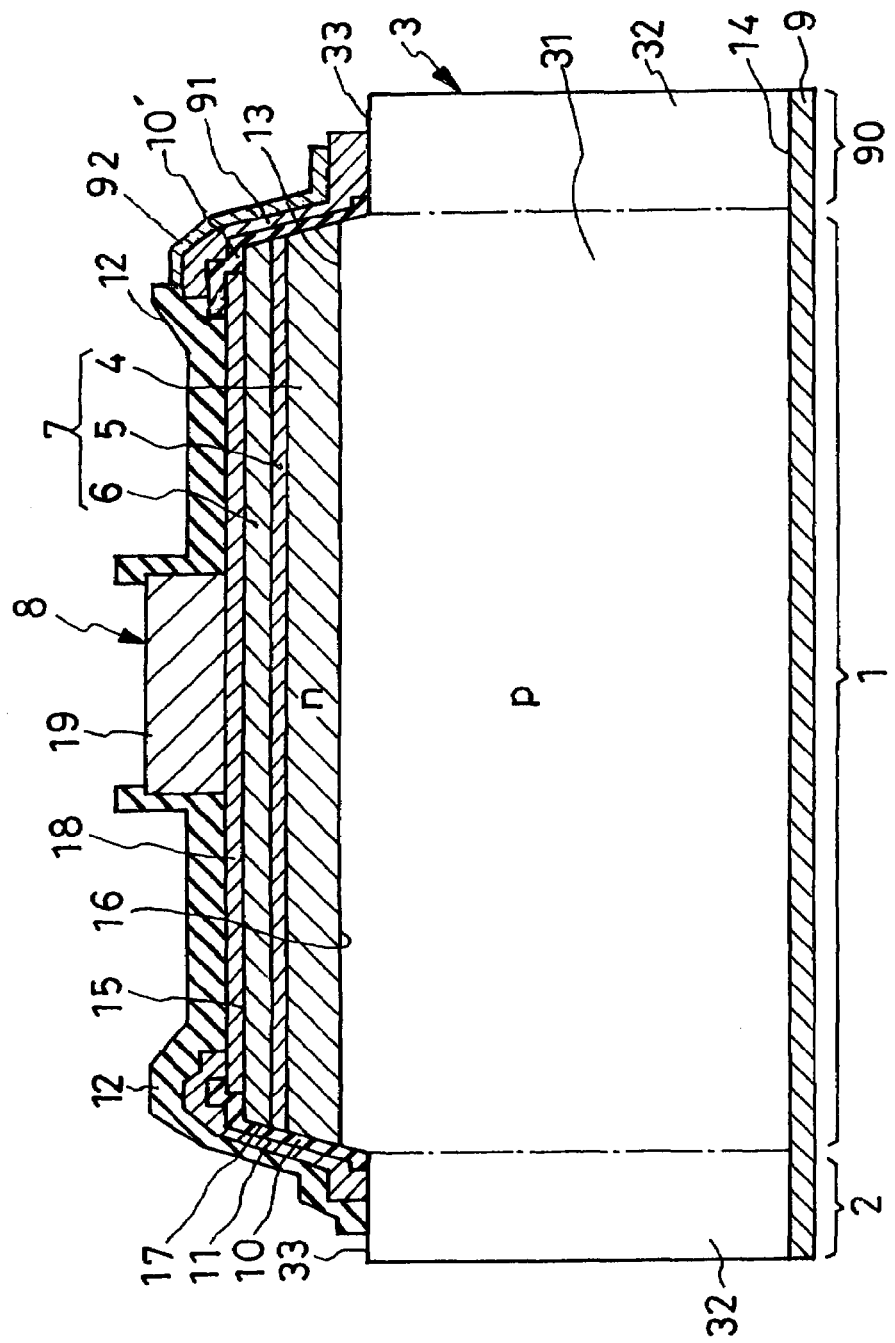
FIG. 20 is a section through a preferred form of overvoltage-protected photocoupler according to the invention.
Figure 21:
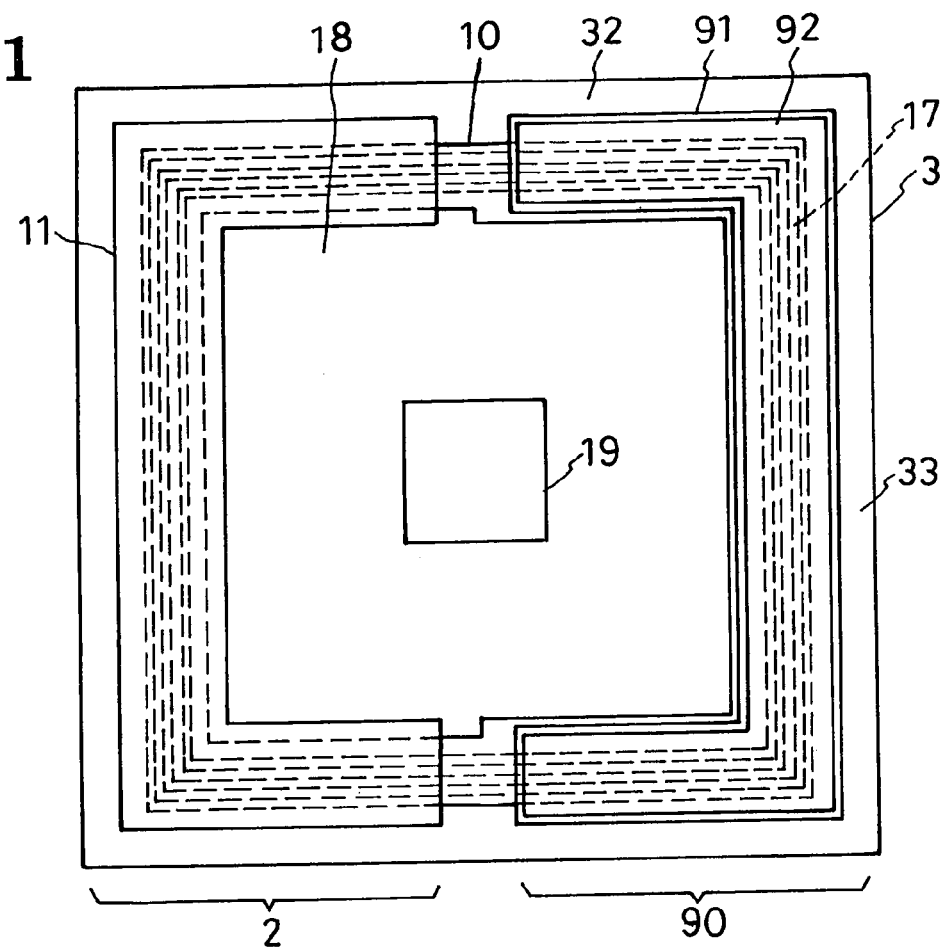
FIG. 21 is a top plan of the FIG. 20 photocoupler, the view not showing the protective covering to reveal the underlying parts.
Figure 22:
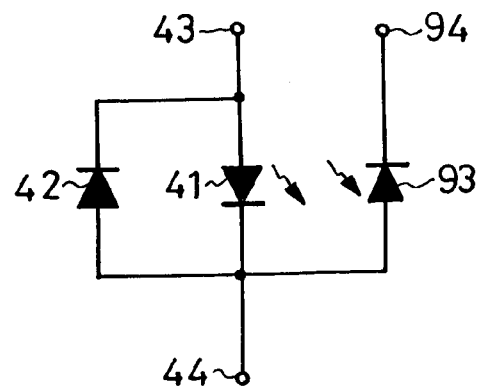
FIG. 22 is an equivalent electrical diagram of the photocoupler of FIG. 20.

Embodiment of FIGS. 20-22

FIGS. 20-22 represent an application of the present invention to an overvoltage-protected "photocoupler," by which is meant the combination of an LED and an output-monitoring photodetector or photosensor. The overvoltage-protected photocoupler could be called the composite semiconductor device. The overvoltage-protected LED of essentially the same construction as that shown in FIG. 1 is integrally combined with a photosensor, which takes the form of a photodiode in this embodiment, to provide the overvoltage-protected photocoupler or self-monitoring LED. As indicated in FIG. 20, therefore, this overvoltage-protected photocoupler is functionally divisible into the LED section 1, the overvoltage protector section 2, and a monitoring photosensor section 90. The LED section 1 is of the same construction as that of FIG. 1.

As better seen in FIG. 21, in which the protective covering 12 is not shown to reveal the underlying parts, the n-type semiconductor film 11 of the overvoltage protector section 2 covers, via the insulating film 10, approximately the left-hand half (first portion), as seen in both FIGS. 20 and 21, of the slanting side surfaces 17 of the light-generating semiconductor region 7 as well as the neighboring part of the ledge 33 of the substrate 3. This protector section 2 is replaceable by either of its FIG. 8 counterpart $2_d$, FIG. 10 counterpart $2_f$, FIG. 12 counterpart $2_g$, FIG. 13 counterpart $2_h$, FIG. 14 counter $2_i$, and FIG. 15 counterpart $2_j$.

For providing a photodiode, the monitoring photosensor section 90 comprises the right-hand half (second portion) of the marginal portion 32 of the substrate 3, a transparent, insulating film 10', an n-type semiconductor film 91, and an electrode 92. Formed in one piece with the insulating film 10 of the overvoltage protector section 2, the insulating film 10' of the photosensor section 90 is mostly held against the slanting side surfaces 17 of the light-generating semiconductor region 7 and has one longitudinal edge portion held against the transparent overlay 18 of the top electrode 8 and another longitudinal edge portion held against the substrate 3. The n-type semiconductor film 91 of the photosensor section 90 is mostly held against the insulating film 10' and has one longitudinal edge portion in pn contact with the right-hand half of the marginal portion 32 of the substrate 3. This semiconductor film 91 is made from the same material, and by the same method, as is the n-type semiconductor film 11 of the protector section 2. The electrode 92 is formed by depositing metal on the semiconductor film 91. Both p-type semiconductor substrate 3 and n-type semiconductor film 91 are made from silicon or like material capable of absorbing the light from the light-generating semiconductor region 7.

As equivalently electrically diagramed in FIG. 22, the overvoltage-protected photocoupler of the above mechanical construction includes the reversely parallel connection of the LED 41 and overvoltage protector diode 42 between the terminals 43 and 44, as has been explained with reference to FIG. 4 showing the electrical makeup of the FIGS. 1-3 embodiment. The monitoring photosensor section 90 of the overvoltage-protected photocoupler provides the photodiode 93 which has an anode connected to the terminal 44 (bottom electrode 9) and a cathode to a third terminal 94 (electrode 92 of the monitoring photosensor section 90).

The photodiode 93 is usually used for sensing the light issuing from the LED 41. A fraction of the light from the light-generating semiconductor region 7 will irradiate the pn junction between the marginal portion 32 of the p-type substrate 3 and the n-type semiconductor film 91 of the photosensor section 90 thereby to be translated into an electric signal. More specifically, being greater in bandgap than the silicon semiconductor substrate 3, the light-generating nitride semiconductor region 7 generates light of such a wavelength that its energy is greater than that of the substrate bandgap. A fraction of this light is converted as aforesaid into electric energy by the photosensor section 90 including the pn-junction photodiode. It is understood that, as is conventional in the optoelectronics art, the terminals 44 and 94 of the FIG. 22 diagram are to be connected to an output circuit, not shown, for providing the electric output from the photodiode 93. The electric output from the unshown output circuit is a current or voltage signal having a prescribed functional relationship (e.g. proportionality) to the intensity or flux of the light from the light-generating semiconductor region 7.

The overvoltage-protected photocoupler offers the following advantages in addition to all those listed in conjunction with the FIG. 1 embodiment:

1. The light being produced by the light-generating semiconductor region 7 of the LED section 1 is accurately and easily monitorable by the photodiode 93 of the photosensor section 90. Further, by thus monitoring the optical output, the photocoupler lends itself to feedback control of its own output light intensity.

2. The monitoring photodiode 93 is compact and inexpensive in construction, being made up from a combination of the marginal portion 32 of the p-type silicon semiconductor substrate 3 and the n-type semiconductor film 91 held against the slanting side surfaces 17 of the light-generating semiconductor region 7. The marginal portion 32 of the substrate 3 is a necessary, inherent appendage of this type of semiconductor device, as has been mentioned, so that the photosensor section 90 does not add to the size of the overvoltage-protected LED at all.

3. The overvoltage-protected photocoupler is easy and inexpensive of manufacture as the monitoring photodiode 93 is made from the same materials and by the same method as is the overvoltage protector diode 42.

4. The overvoltage-protected photocoupler is materially simplified in construction as its LED section 1, overvoltage protector section 2, and monitoring photosensor section 90 all share the bottom electrode 9.

Figure 23:
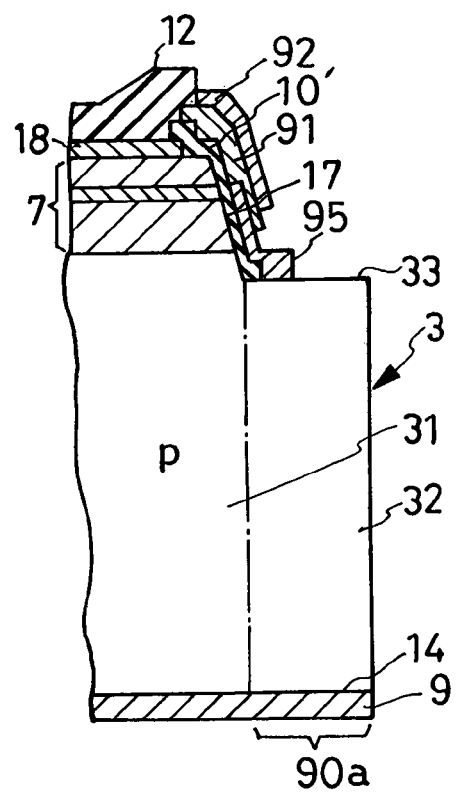
FIG. 23 is a fragmentary section thorough another preferred form of overvoltage-protected photocoupler according to the invention.

Embodiment of FIG. 23

FIG. 23 shows a modification $90_a$ of the monitoring photosensor section 90 of the overvoltage-protected photocoupler of FIGS. 20-22. The modified photosensor section $90_a$ presupposes use in combination with the LED section 1, FIG. 1, and with the overvoltage protector section $2_d$, FIG. 8, instead of with the overvoltage protector section 2 of FIGS. 20 and 21.

The modified photosensor section $90_a$ is similar in construction to the first disclosed photosensor section 90, FIGS. 20 and 21, in that it is comprised of the right-hand half of the marginal portion 32 of the substrate 3 and the means formed thereon. The means on the right-hand half of the marginal portion 32 include an n-type semiconductor film 91, a p-type semiconductor film 95, and the photodiode electrode 92. Made from the same material and by the same method as the p-type semiconductor film 50, FIG. 8, of the overvoltage protector section $2_d$, the p-type semiconductor film 95 of the modified photosensor section $90_a$ is in part formed on the marginal portion 32 of the p-type silicon semiconductor substrate 3 in electrical contact therewith and in part held against the slanting side surfaces 17 of the light-generating semiconductor region 7 via the transparent insulating film 10'.

The n-type semiconductor film 91 of the modified photosensor section $90_a$ is made from the same material and by the same method as the n-type semiconductor film 11, FIG. 8. The n-type semiconductor film 91 partly makes pn contact with the p-type semiconductor film 95 and is partly held against the slanting side surfaces 17 of the light-generating semiconductor region 7 via the transparent insulating film 10'. The n-type semiconductor film 91 and p-type semiconductor film 95 are both capable of absorbing the light from the light-generating semiconductor region 7. Therefore, constituted of these semiconductor films 91 and 95 of opposite conductivity types, the photodiode of the modified photosensor section $90_a$ functions like that of the FIG. 20 embodiment.

As in the photosensor section 90, FIG. 20, the n-type semiconductor film 91 of the modified photosensor section $90_a$ is electrically coupled to the photodiode electrode 92. The p-type semiconductor film 95 on the other hand is electrically coupled to the bottom electrode 9 via the marginal portion 32 of the p-type silicon semiconductor substrate 3. Being made from a silicon semiconductor capable of absorbing the light from the light-generating semiconductor region 7, the marginal portion 32 of the substrate 3 is photoconductive, rising in electric conductivity in response to the incoming light.

It is self-evident that the modified overvoltage-protected photocoupler of FIG. 23 possesses all the advantages of the FIG. 20 embodiment. The modified photosensor section $90_a$ may most desirably be put to use in combination with the overvoltage protector section $2_d$, FIG. 8, for ease of manufacture. Theoretically, however, the photosensor section $90_a$ may be combined with either of the FIG. 1 protector section 2, FIG. 10 protector section $2_f$, FIG. 12 protector section $2_g$, FIG. 13 protector section $2_h$, FIG. 14 protector section $2_i$, and FIG. 15 protector section $2_j$.

Figure 24:
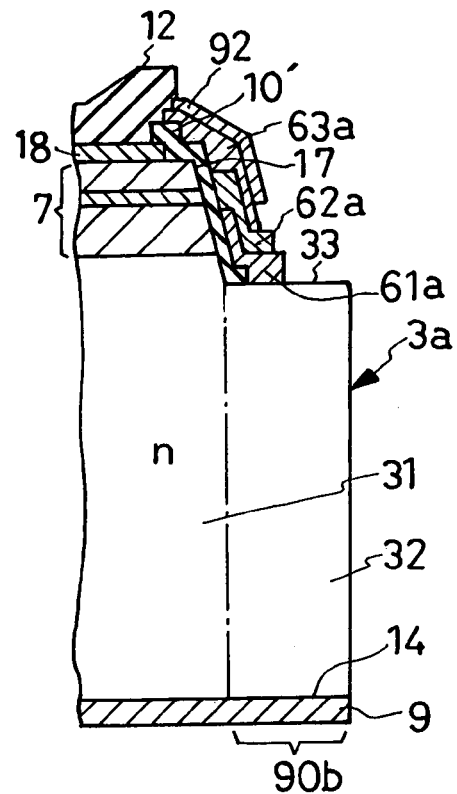
FIG. 24 is a fragmentary section thorough a further preferred form of overvoltage-protected photocoupler according to the invention.

Embodiment of FIG. 24

FIG. 24 shows another modification $90_b$ of the monitoring photosensor section 90 of the overvoltage-protected photocoupler of FIGS. 20-22. The modified photosensor section $90_b$ provides a phototransistor, which best matches in construction the overvoltage protector section $2_f$, FIG. 10. This embodiment also differs from that of FIGS. 20-22 in having an n-type silicon semiconductor substrate $3_a$.

The second modified photosensor section $90_b$ is similar in construction to the first disclosed photosensor section 90, FIGS. 20 and 21, in that it is comprised of the right-hand half of the marginal portion 32 of the substrate $3_a$ and the means formed thereon. The means on the right-hand half of the marginal portion 32 include an n-type semiconductor film $61_a$, a p-type semiconductor film $62_a$, an n-type semiconductor film $63_a$, and a phototransistor electrode 92. The three semiconductor films $61_a$, $62_a$ and $63_a$ constitute in combination an npn phototransistor.

Made from the same material and by the same method as the n-type semiconductor film 61, FIG. 10, of the overvoltage protector section $2_f$, the n-type semiconductor film $61_a$ of the photosensor section $90_b$ is held in part against the marginal portion 32 of the n-type semiconductor substrate $3_a$ and in part against the slanting side surfaces 17 of the light-generating semiconductor region 7 via the transparent insulating film 10'. A metal layer, not shown, could be interposed between the n-type semiconductor film $61_a$ and the marginal portion 32 of the substrate $3_a$.

Also made from the same material and by the same method as the p-type semiconductor film 62, FIG. 10, of the overvoltage protector section $2_f$, the p-type semiconductor film $62_a$ of the photosensor section $90_b$ is held in part against the n-type semiconductor film $61_a$ in pn contact therewith and in part against the slanting side surfaces 17 of the light-generating semiconductor region 7 via the transparent insulating film 10'.

Also made from the same material and by the same method as the n-type semiconductor film 63, FIG. 10, of the overvoltage protector section $2_f$, the n-type semiconductor film $63_a$ of the photosensor section $90_b$ is held in part against the p-type semiconductor film $62_a$ in pn contact therewith and in part against the slanting side surfaces 17 of the light-generating semiconductor region 7 via the transparent insulating film 10'. The n-type semiconductor film $61_a$, p-type semiconductor film $62_a$ and n-type semiconductor film $63_a$ of the photosensor section $90_b$ are all capable of absorbing the light from the light-generating semiconductor region 7.

The phototransistor electrode 92 is electrically coupled to the n-type semiconductor film $63_a$. This film $63_a$ in turn is electrically coupled to the bottom electrode 9 via the marginal portion 32 of the n-type silicon semiconductor substrate $3_a$. The marginal portion 32 is photoconductive as aforesaid, rising in conductivity when the LED is radiating.

Comprising the n-type semiconductor film $61_a$, p-type semiconductor film $62_a$ and n-type semiconductor film $63_a$, the npn phototransistor is capable, like the photodiode, of translating optical energy into electric energy. Thus this embodiment provides an overvoltage-protected, self-monitoring LED similar to that of FIGS. 20-22.

The second modified photosensor section $90_b$ may most desirably be put to use in combination with the overvoltage protector section $2_f$, FIG. 10, for ease of manufacture. Theoretically, however, photosensor section $90_b$ may be combined with either of FIG. 1 protector section 2, FIG. 8 protector section $2_d$, FIG. 12 protector section $2_g$, FIG. 13 protector section $2_h$, FIG. 14 protector section $2_i$, and FIG. 15 protector section $2_j$.

Figure 25:
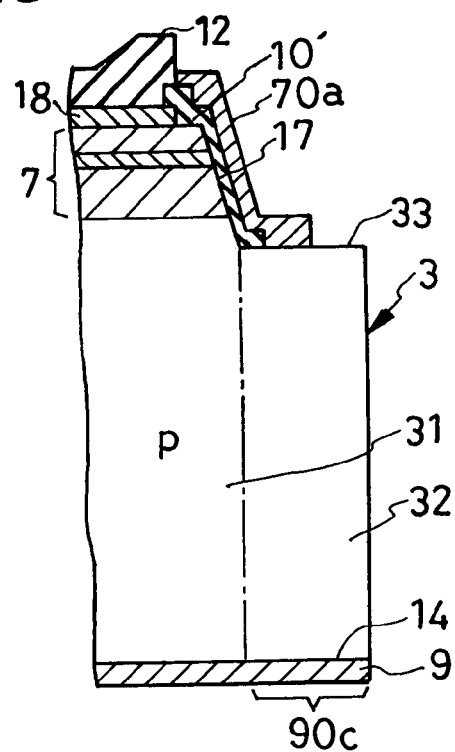
FIG. 25 is a fragmentary section thorough a further preferred form of overvoltage-protected photocoupler according to the invention.

Embodiment of FIG. 25

Shown in FIG. 25 is a further modification $90_c$ of the monitoring photosensor section 90 of the overvoltage-protected photocoupler of FIGS. 20-22. The modified photosensor section $90_c$ provides a Schottky diode, which best matches in construction the overvoltage protector section $2_g$, FIG. 12.

The third modified photosensor section $90_c$ is similar in construction to the first disclosed photosensor section 90, FIGS. 20 and 21, in that it is comprised of the right-hand half of the marginal portion 32 of the substrate 3 and the means formed thereon. The means on the right-hand half of the marginal portion 32 include a metal layer or Schottky electrode $70_a$. Made from the same material and by the same method as the metal layer 70, FIG. 12, of the overvoltage protector section $2_g$, the Schottky electrode $70_a$ makes Schottky contact with the marginal portion 32 of the p-type silicon semiconductor substrate 3, besides being held against the slanting side surfaces 17 of the light-generating semiconductor region 7 via the insulating film 10'.

The Schottky electrode $70_a$ of the photosensor section $90_c$ is functionally equivalent to the electric output terminal 94, FIG. 22, of the equivalent electrical diagram which applies to this embodiment as well. Besides constituting a Schottky diode in combination with the electrode $70_a$, the marginal portion 32 of the p-type silicon semiconductor substrate 3 serves to electrically connect the electrode to the other electrode 9, increasing in conductivity when irradiated by the light from the light-generating semiconductor region 7. The substrate 3 to make Schottky contact with the electrode $70_a$ might be made from materials other than silicon that were capable of absorbing the light from the light-generating semiconductor region 7.

Incorporating a Schottky diode, this embodiment provides an overvoltage-protected, self-monitoring LED similar to that of FIGS. 20-22. The third modified photosensor section $90_c$ may most desirably be put to use in combination with the overvoltage protector section $2_g$, FIG. 12, for ease of manufacture. Theoretically, however, it may be combined with either of the FIG. 1 protector section 2, FIG. 8 protector section $2_d$, FIG. 10 protector section $2_f$, FIG. 13 protector section $2_h$, FIG. 14 protector section $2_i$, and FIG. 15 protector section $2_j$.

Figure 26:
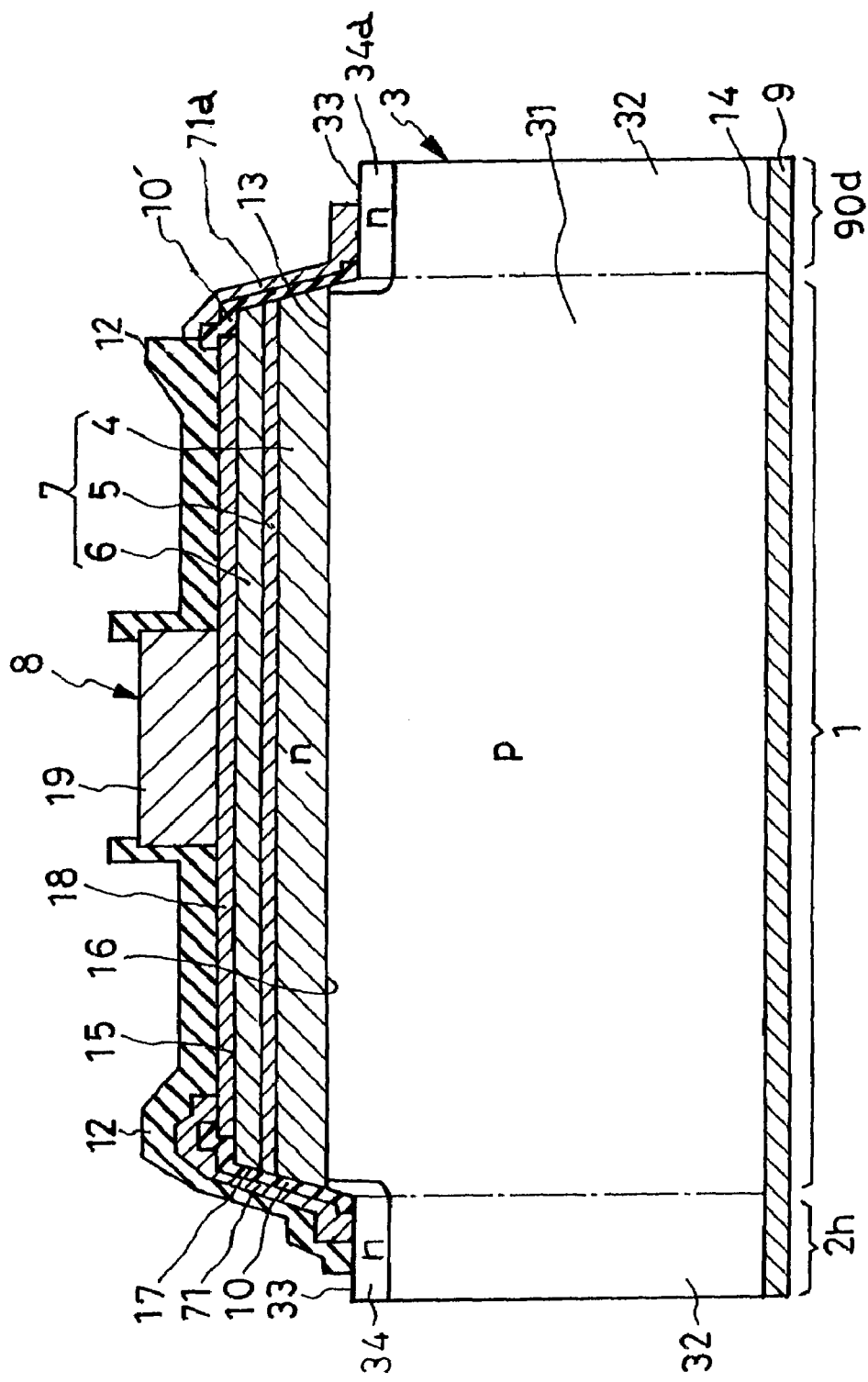
FIG. 26 is a section thorough a further preferred form of overvoltage-protected photocoupler according to the invention.

Embodiment of FIG. 26

FIG. 26 is an illustration of a further preferred form of overvoltage-protected photocoupler which incorporates a photodiode in its monitoring photosensor section $90_d$. Another difference of this embodiment from that of FIGS. 20-22 is that its overvoltage protector section $2_h$ is of the same construction as the left-hand half of its FIG. 13 counterpart designated therein by the same reference characters.

The photosensor section $90_d$ is similar in construction to that of FIGS. 20 and 21 in that it is comprised of the right-hand half of the marginal portion 32 of the substrate 3 and means associated therewith. The associated means include an n-type semiconductor region $34_a$ and a metal layer $71_a$. Made from the same substance and by the same method as the n-type semiconductor region 34, FIG. 13, the n-type semiconductor region $34_a$ of this photosensor section $90_d$ extends to a certain depth from the surface of the substrate ledge 33, creating a pn junction with the marginal portion 32 of the p-type silicon semiconductor substrate 3. Both substrate 3 and region $34_a$ might be made from semiconductors other than those containing silicon, provided that such materials are capable of absorbing the light from the light-generating semiconductor region 7.

Like the metal layer 71, FIGS. 13 and 26, of the overvoltage protector section $2_h$, the metal layer $71_a$ of the photosensor section $90_d$ is mostly held against the slanting side surfaces of the light-generating semiconductor region 7 via the insulating layer 10', and edgewise against the n-type semiconductor region $34_a$ in electric contact therewith. The marginal substrate portion 32 of the photosensor section $90_d$ serves not only as the p-type region of the monitoring photodiode but as the conductor for electrically coupling the photodiode to the bottom electrode 9, rising in conductivity when irradiated by the light.

This embodiment is essentially of the same construction as that of FIGS. 20 and 21, offering the same advantages therewith. Although the photosensor section $90_d$ may most desirably be employed in combination with the overvoltage protector section $2_h$, FIG. 13, for ease of manufacture, it permits combination with either of the FIG. 1 protector section 2, FIG. 8 protector section $2_d$, FIG. 10 protector section $2_f$, FIG. 12 protector section $2_g$, FIG. 14 protector section $2_i$, and FIG. 15 protector section $2_j$.

Figure 27:
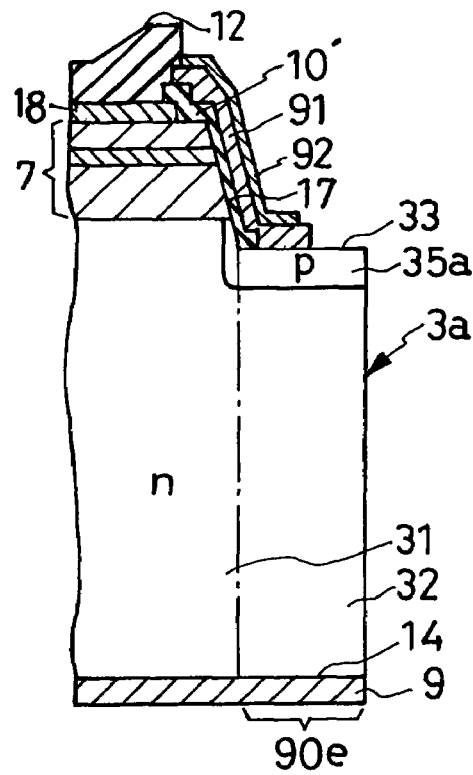
FIG. 27 is a fragmentary section thorough a further preferred form of overvoltage-protected photocoupler according to the invention.

Embodiment of FIG. 27

A further modified monitoring photosensor section seen at $90_e$ in FIG. 27 employs an npn phototransistor, which has a construction in accord with that of the overvoltage protector section $2_i$, FIG. 14. It is therefore understood that, although omitted from the showing of FIG. 27, the overvoltage protector section of this embodiment is constructed like the left-hand half of the FIG. 14 overvoltage protector section $2_i$. An additional difference of this overvoltage-protected photocoupler from that of FIGS. 20-22 is that the former has an n-type silicon semiconductor substrate $3_a$ instead of that of p-type as in the latter.

The photosensor section $90_e$ is similar in construction to the first disclosed photosensor section 90, FIGS. 20 and 21, in that it is comprised of the right-hand half of the marginal portion 32 of the substrate $3_a$ and means associated therewith for providing an npn phototransistor. The associated means include a p-type semiconductor region $35_a$, an n-type semiconductor film 91, and an electrode 92.

Made from the same substance and by the same method as the p-type semiconductor region 35, FIG. 14, the p-type semiconductor region $35_a$ of the photosensor section $90_e$ extends to a certain depth from the surface of the substrate ledge 33. Made from the same substance and by the same method as the n-type semiconductor film 11, FIG. 14, of the overvoltage protector section $2_i$, the n-type semiconductor film 91 is mostly held against the slanting side surfaces 17 of the light-generating semiconductor region 7 via the transparent insulating film 10' and joined edgewise to the p-type semiconductor region $35_a$ in pn contact therewith. All of the substrate $3_a$, p-type semiconductor region $35_a$ and n-type semiconductor film 91 are made from silicon or like material capable of absorbing the light from the light-generating semiconductor region 7.

The electrode 92 of the photosensor section 90$_e$ is electrically coupled to the n-type semiconductor film 91, providing an electric output similar to that indicated at 94 in FIG. 22. Besides being utilized for creation of the p-type semiconductor region 35$_a$ therein, the marginal substrate portion 32 of the photosensor section 90$_d$ serves as the n-type region of the monitoring npn phototransistor and additionally as the conductor for electrically coupling the phototransistor to the bottom electrode 9, rising in conductivity when irradiated by the light.

This embodiment essentially differs from that of FIGS. 20 and 21 in that an npn phototransistor, instead of a photodiode, is built into its monitoring photosensor section 90$_e$, so that it offers the same advantages therewith. Although the photosensor section 90$_e$ may most desirably be employed in combination with the overvoltage protector section 2$_i$, FIG. 14, for ease of manufacture, it permits combination with either of the FIG. 1 protector section 2, FIG. 8 protector section 2$_d$, FIG. 10 protector section 2$_f$, FIG. 12 protector section 2$_g$, FIG. 13 protector section 2$_h$, and FIG. 15 protector section 2$_j$.

Figure 28:
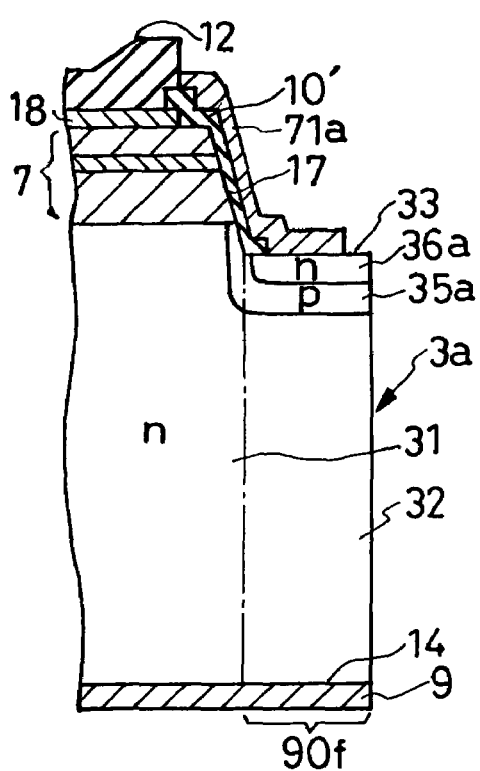
FIG. 28 is a fragmentary section thorough a still further preferred form of overvoltage-protected photocoupler according to the invention.
Figure 29:
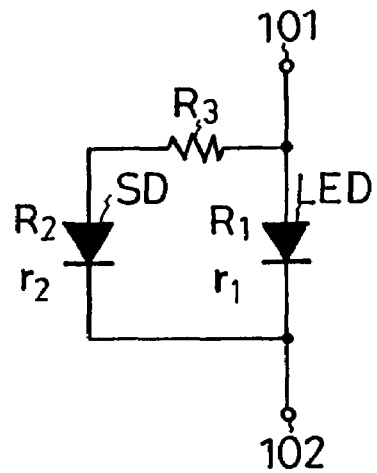
FIG. 29 is a schematic electrical diagram of the prior art overvoltage-protected light-emitting semiconductor device.

Embodiment of FIG. 28

A still further modified monitoring photosensor section indicated at 90$_f$ in FIG. 28 employs an npn phototransistor of slightly different construction from that of FIG. 27. The construction of the modified npn phototransistor is in conformity with that of the overvoltage protector section 2$_j$, FIG. 15. It is therefore understood that, although not shown in FIG. 28, the overvoltage protector section of the present embodiment is constructed like the left-hand half of the FIG. 15 overvoltage protector section 2$_j$. This overvoltage-protected photocoupler also differs from that of FIGS. 20-22 in having an n-type silicon semiconductor substrate 3$_a$.

The photosensor section 90$_f$ of the FIG. 28 embodiment is similar in construction to the first disclosed photosensor section 90, FIGS. 20 and 21, in that it is comprised of the right-hand half of the marginal portion 32 of the substrate 3$_a$ and means associated therewith for providing an npn phototransistor. The associated means include a p-type semiconductor region 35$_a$, an n-type semiconductor region 36$_a$, and a metal layer 71$_a$.

The p-type semiconductor region 35$_a$ and n-type semiconductor region 36$_a$ of the photosensor section 90$_f$ are made from the same substances and by the same method as their FIG. 15 counterparts 35 and 36. The p-type semiconductor region 35$_a$ is first formed in the right-hand half of the marginal portion 32 of the substrate 3$_a$ to a required depth from the ledge 33. Then the n-type semiconductor region 36$_a$ is formed in the same right-hand half of the marginal portion 32 of the substrate 3$_a$ to a shallower depth from the ledge 33, creating a pn junction with the p-type semiconductor region 35$_a$ left thereunder. All of the substrate 3$_a$, p-type semiconductor region 35$_a$ and n-type semiconductor region 36$_a$ are made from silicon or other material capable of absorbing the light from the light-generating semiconductor region 7.

Made from the same material and by the same method as its FIG. 15 counterpart 71, the metal layer 71$_a$ of the photosensor section 90$_f$ is electrically coupled to the n-type semiconductor region 36$_a$, providing an electric output similar to that indicated at 94 in FIG. 22. Besides being used as a part of the monitoring npn phototransistor, the marginal substrate portion 32 of the photosensor section 90$_f$ serves as the conductor for electrically coupling the phototransistor to the bottom electrode 9, rising in conductivity when irradiated by the light from the light-generating semiconductor region 7.

This embodiment essentially differs from that of FIGS. 20 and 21 in that an npn phototransistor, instead of a photodiode, is built into its monitoring photosensor section 90$_f$, so that it offers the same advantages therewith. Although the photosensor section 90$_f$ may most desirably be employed in combination with the overvoltage protector section 2$_j$, FIG. 15, for ease of manufacture, it permits combination with either of the FIG. 1 protector section 2, FIG. 8 protector section 2$_d$, FIG. 10 protector section 2$_f$, FIG. 12 protector section 2$_g$, FIG. 13 protector section 2$_h$, and FIG. 14 protector section 2$_i$.

Possible Modifications

Although the present invention has been shown and described hereinbefore in terms of some currently preferred overvoltage-protected LEDs and self-monitoring photocouplers, it is not desired that the invention be limited by the exact details of such embodiments or by the description thereof. The following is a brief list of possible modifications, alterations or adaptations of the illustrated semiconductor devices which are all believed to fall within the purview of the claims annexed hereto:

1. The transparent overlay 18, and open-worked overlay 18$_a$, of the top electrode 8 are both not absolute necessities. However, if they are omitted, a known current-spreading layer may be built instead into the light-generating semiconductor region 7.
2. The semiconductor substrates 3 and 3$_a$ of FIGS. 8-10 and 16 are replaceable with a metal-made substrate.
3. The light radiated from the light-generating semiconductor region 7 toward the substrate 3, 3$_a$ or 3$_b$ may be reflected back toward the light-emitting surface of the LED, either by making the bottom electrode from a reflective material or by providing a reflective layer on either of the opposite major surfaces of the substrate.
4. Light may be made to issue from the surface 14 of the substrate as well.
5. The main portion 31 and marginal portion 32 of the substrate 3 or 3$_a$ may differ in impurity concentration.
6. The substrate 3 or 3$_a$, the layers 4-6 of the light-generating semiconductor region 7, the semiconductor films 11, 50, 61-63 of the overvoltage protector section 2 or 2$_a$-2$_m$, and the semiconductor regions 34-36 in the substrate are all reversible in conductivity types.
7. The substrate may be made not only from monocrystalline silicon but from polycrystalline silicon, silicon carbide or other silicon compounds, or Groups III-V compound semiconductors.
8. A light-generating semiconductor region could be preformed and joined, as under heat and pressure, to a semiconductor or meal-made substrate instead of being epitaxially grown thereon.
9. An additional overvoltage protector, perhaps chosen from among a pn-junction diode, npn or pnp diode, Schottky diode, varistor, and capacitor, could be incorporated in the overvoltage protector section of the various embodiments disclosed. A parallel connection of a capacitor with a pn-junction diode or the like is particularly effective for overvoltage protection.
10. The overvoltage protectors of the FIGS. 1, 5-10, 13, 14, 16, 18 and 19 embodiments may take the form of discrete diodes, varistors, capacitors and the like, instead of being made from the semiconductor films as shown. Various possible combinations of semiconductor films and discrete devices may also be employed as overvoltage protectors in the practice of this invention.

11. A photoconductive sensor may be employed in lieu of the photodiode or phototransistor of the photosensor section. A photoconductive sensor is obtainable by placing the metal layer 70$_a$, FIG. 25, in ohmic contact with the substrate 3 capable of absorbing light. (The photosensor of FIG. 25 might be considered a combination of a Schottky barrier photosensor and a photoconductive photosensor since the substrate 3 of this embodiment is photoconductive.)

12. The insulating film 10 of FIGS. 20 and 23-28 is replaceable by an extension from the transparent protective film 12.

13. The photosensor section of FIGS. 20 and 23-28 may be furnished with a light shield except where it must be irradiated by the light from the light-generating semiconductor section.

What is claimed is:

1. A light-emitting semiconductor device protected against destruction or weakening due to overvoltages, comprising:
   (a) a substrate of electroconductive material having a major surface, the substrate being of a semiconductor of a first conductivity type;
   (b) a light-generating semiconductor region formed on the major surface of the substrate, the light-generating semiconductor region having a first major surface facing away from the substrate and a second major surface held against the major surface of the substrate and a side surface between the first and the second major surface;
   (c) a first electrode on the first major surface of the light-generating semiconductor region;
   (d) a second electrode electrically coupled to the substrate; and
   (e) a semiconductor film of a second conductivity type, opposite to said first conductivity type, held against the side surface of the light-generating semiconductor region, against the substrate to form a pn junction, and against the first electrode in electric contact therewith for protecting the light-emitting semiconductor device from overvoltages.

2. The overvoltage-protected light-generating semiconductor device of claim 1, wherein the first electrode includes a transparent overlay covering the first major surface of the light-generating semiconductor region, and wherein the semiconductor film is made from the same transparent material as the transparent overlay of the first electrode.

3. The overvoltage-protected light-generating semiconductor device of claim 1, wherein the first electrode includes a transparent overlay covering the first major surface of the light-generating semiconductor region, and wherein the semiconductor film is made from a transparent material and additionally covers the transparent overlay of the first electrode for protection purposes.

4. The overvoltage-protected light-emitting semiconductor device of claim 1, wherein the overvoltage protector further comprises an insulating film through which the semiconductor film is held against the side surface of the light-generating semiconductor region.

5. The overvoltage-protected light-emitting semiconductor device of claim 1, wherein the first electrode comprises:
   (a) an overlay held against the first major surface of the light-generating semiconductor region; and
   (b) a bonding pad formed on part of the overlay.

6. The overvoltage-protected light-emitting semiconductor device of claim 5, wherein the overlay of the first electrode is transparent to the light from the light-generating semiconductor region.

7. The overvoltage-protected light-emitting semiconductor device of claim 1, wherein the semiconductor film is transparent to the light from the light-generating semiconductor region.

8. The overvoltage-protected light-emitting semiconductor device of claim 1, wherein the substrate has a main portion and, around the same, a marginal portion, and wherein the semiconductor film has a edge portion held against the marginal portion of the substrate to form a pn junction.

* * * * *